(12) United States Patent
Ohtani et al.

(10) Patent No.: US 11,654,513 B2
(45) Date of Patent: May 23, 2023

(54) WORKPIECE-SEPARATING DEVICE AND WORKPIECE-SEPARATING METHOD

(71) Applicant: SHIN-ETSU ENGINEERING CO., LTD., Tokyo (JP)

(72) Inventors: Yoshikazu Ohtani, Gunma (JP); Kyouhei Tomioka, Gunma (JP)

(73) Assignee: SHIN-ETSU ENGINEERING CO., LTD., Tokyo (JP)

( * ) Notice: Subject to any disclaimer, the term of this patent is extended or adjusted under 35 U.S.C. 154(b) by 17 days.

(21) Appl. No.: 17/054,952

(22) PCT Filed: May 17, 2019

(86) PCT No.: PCT/JP2019/019733
§ 371 (c)(1),
(2) Date: Nov. 12, 2020

(87) PCT Pub. No.: WO2019/221285
PCT Pub. Date: Nov. 21, 2019

(65) Prior Publication Data
US 2021/0245297 A1    Aug. 12, 2021

(30) Foreign Application Priority Data

May 17, 2018   (JP) .............................. JP2018-095196
Nov. 16, 2018   (WO) .................. PCT/JP2018/042533

(51) Int. Cl.
*B23K 26/082*   (2014.01)
*B23K 26/0622*   (2014.01)
(Continued)

(52) U.S. Cl.
CPC ........ *B23K 26/082* (2015.10); *B23K 26/0622* (2015.10); *B23K 26/0648* (2013.01); *B23K 26/57* (2015.10); *B23K 2101/40* (2018.08)

(58) Field of Classification Search
CPC .. B23K 26/0648; B23K 26/082; B23K 26/57; B23K 26/0622; B23K 26/352; B23K 2101/40
See application file for complete search history.

(56) References Cited

U.S. PATENT DOCUMENTS

2007/0084837 A1\* 4/2007 Kosmowski ....... B23K 26/0853
219/121.68
2012/0152918 A1   6/2012 Li et al.
(Continued)

FOREIGN PATENT DOCUMENTS

JP   H10-189496   7/1998
JP   2008-229682   10/2008
(Continued)

OTHER PUBLICATIONS

Korean Office Action in corresponding Korean Application No. 10-2020-7033561, dated Feb. 21, 2022 (and English translation thereof).
(Continued)

*Primary Examiner* — Thien S Tran
(74) *Attorney, Agent, or Firm* — Greenblum & Bernstein, P.L.C.

(57) ABSTRACT

A workpiece-separating device includes: a holding member that detachably holds a workpiece of a laminated body in which the workpiece that includes a circuit board and a supporting body through which laser beams pass are laminated with each other via a separating layer that peelably alters due to at least absorption of the laser beams; a light irradiation part that irradiates the laser beams toward the separating layer through the supporting body of the laminated body held by the holding member; a driving part that relatively moves a light irradiation position of irradiation from the light irradiation part with respect to the supporting body and the separating layer of the laminated body held by
(Continued)

the holding member in at least a direction crossing a light irradiation direction of irradiation from the light irradiation part; and a controlling part that operates and controls the light irradiation part and the driving part.

12 Claims, 10 Drawing Sheets

(51) Int. Cl.
*B23K 26/57* (2014.01)
*B23K 26/06* (2014.01)
*B23K 101/40* (2006.01)

(56) References Cited

U.S. PATENT DOCUMENTS

| | | | | |
|---|---|---|---|---|
| 2013/0119031 A1* | 5/2013 | Matsuda | ............. | B23K 26/064 219/121.85 |
| 2015/0035554 A1* | 2/2015 | Dang | ................. | G01R 31/2607 428/408 |
| 2016/0368088 A1* | 12/2016 | Kudo | ................... | B23K 26/382 |

FOREIGN PATENT DOCUMENTS

| | | | | |
|---|---|---|---|---|
| JP | 2012-024783 | 2/2012 | | |
| JP | 2013-179237 | 9/2013 | | |
| JP | 2014-504956 | 2/2014 | | |
| JP | 2017084910 A | * 5/2017 | ............. | B23K 26/53 |
| JP | 2018-006488 | 1/2018 | | |
| WO | WO2007/061459 A2 | 5/2007 | | |
| WO | WO2012/108056 | 8/2012 | | |
| WO | WO2015/014265 A1 | 2/2015 | | |

OTHER PUBLICATIONS

International Search Report in International Patent Application No. PCT/JP2019/019733, dated Jun. 25, 2019 (and English-translation thereof).
Written Opinion in International Patent Application No. PCT/JP2019/019733, dated Jun. 25, 2019 (and English-translation thereof).
International Preliminary Report on Patentability in International Patent Application No. PCT/JP2019/019733, dated. Jun. 26, 2020 (and English-translation thereof).
Office Action for corresponding Taiwan patent application No. 108117220 dated May 12, 2022 (and English translation thereof).

* cited by examiner

WORKPIECE-SEPARATING DEVICE AND WORKPIECE-SEPARATING METHOD

TECHNICAL FIELD

The present invention relates to a workpiece-separating device and a workpiece-separating method using the workpiece-separating device, which are used to peel a workpiece, which is held through tentative fixing to a supporting body, from a supporting body in a process of manufacturing a workpiece as a product, exemplified by a treatment process for a semiconductor wafer having an ultrathin thickness, or WLP (wafer level packaging) and, PLP (panel level packaging).

BACKGROUND ART

Conventionally, for such a workpiece-separating device and a workpiece-separating method, there have been a supporting body separation device and a supporting body separation method in which light is irradiated onto a laminated body having a configuration in which a substrate and a supporting body through which light passes are laminated with each other via a separating layer that alters due to light absorption, with the light being irradiated through a light passing part of a holding part, whereby the supporting body is separated from the laminated body (see, for example, PTL 1).

The supporting body separation device has a fixing part (stage) that fixes a face onto the opposite side to the supporting body in the laminated body, a light irradiation part (laser irradiation part) that irradiates a separating layer with light (laser beam) via the supporting body, and a holding part that holds the supporting body. The holding part is arranged between the stage and the laser irradiation part and has light passing parts through which the laser beams irradiated by the laser irradiation part pass.

The holding part has a structure constituted in a frame form, an adsorption pad is provided on the frame, and inner side opening parts surrounded by the frame are used as the light passing parts.

The stage has a fixing face including an adsorption fixing part for adsorbing the laminated body and a pair of clamps that serves as pressing parts for pressing the laminated body toward the fixing face.

In a light irradiation process performed on the separating layer, the laser irradiation part and the stage are relatively moved after the pressed state of the laminated body by the clamps is released, whereby the laser beams from the laser irradiation part pass through the inner-side light passing parts surrounded by the frame of the holding part and are irradiated onto the separating layer. In the separating layer, a portion onto which the laser beam is irradiated is altered.

In a case in which the laminated body is curved, the laminated body is adsorbed and held on the fixing face of the stage and curvature thereof is corrected so as to be made flat. In this manner, the separating layer and the focal point of the laser beam are aligned.

Further, as another workpiece-separating method, there is a laser lift-off method wherein a workpiece, in which a crystal layer is formed on a substrate, is irradiated with pulsed laser beams through the substrate, and the pulsed laser beams are irradiated so that, while irradiation areas of irradiation in the workpiece with the pulsed laser beams are changed every moment, ends of irradiation areas adjacent to each other in the movement direction of the irradiation areas overlap and so that ends of the irradiation areas adjacent to each other in a direction orthogonal to the movement direction overlap, whereby the crystal layer is peeled from the interface between the substrate and the crystal layer (see, for example, PTL 2).

The workpiece is divided into the irradiation areas each having a size corresponding to one shot (one pulse) of the pulsed laser beams. In a method for irradiation by the pulsed laser beams from a laser optical system onto the workpiece with respect to the respective irradiation areas, the pulsed laser beams are irradiated onto the respective irradiation areas one by one due to conveyance of the workpiece, with the ends (edge parts) of the irradiation areas overlapping with each other.

The pulsed laser beams generated by a laser source are projected onto the workpiece via a laser optical system and irradiated via a substrate onto the interface between the substrate and the crystal layer (a material layer made of a GaN compound). At the interface between the substrate and the material layer, due to irradiation of the pulsed laser beams, GaN is decomposed near the interface between the substrate and the material layer, and the material layer is peeled from the substrate.

CITATION LIST

Patent Literature

[PTL 1] Japanese Patent Application Laid-open No. 2018-006488

[PTL 2] Japanese Patent Application Laid-open No. 2012-024783

SUMMARY OF INVENTION

Technical Problem

Meanwhile, when the laser beams are used as light irradiated from the light irradiation part onto the laminated body, it is not easy to adjust focal positions of the laser beams with respect to the separating layer of the laminated body that is deformed due to curvature thereof or the like and is extremely difficult to uniformly perform irradiation by the laser beams onto an entire face of the separating layer and implement separation (peeling off).

However, in the disclosure in PTL 1, only the laser beams passing through the light passing parts of the holding part from the laser irradiation part are irradiated onto the separating layer. Therefore, the laser beams are not irradiated onto portions facing the adsorption pads and the frame surrounding the light passing parts in the separating layer.

That is, the device has a structure in which the laser beams are irradiated while avoiding irradiating the frame and the adsorption pads, hence non-irradiated portions having the same shapes as those of the frame and the adsorption pads are generated in a part of the separating layer.

In the disclosure in PTL 2, the size of each irradiation area corresponding to one shot of the pulsed laser beams is large, therefore, the pulsed laser beams irradiated from the laser optical system onto the respective irradiation areas cannot be sufficiently focused. Because of this, an energy amount (energy density) of the pulsed laser beam irradiated onto each of the irradiation areas may not reach a level at which an entire face of the crystal layer (a material layer made of the GaN compound) is uniformly decomposed.

This may result in a problem of easier and partial occurrence of irradiation irregularities of the laser beams onto the separating layer of the laminated body, which may cause a partial peeling failure in portions where laser output is insufficient, or non-irradiated portions in the separating layer, or a problem of damage caused in a device formed in a circuit board of a chip mounted on a substrate in portions where the laser output is, on the contrary, too strong, or a problem of soot occurring due to excessive irradiation of the laser beams, or the like.

Particularly, in a case where the laminated body is curved even slightly and when the laser beam is continuously irradiated from the end of the laminated body and the laminated body is successively peeled off, internal stress due to the curvature is locally released in the continuous wide areas. Therefore, problems may arise in that cracks may occur in an interface of a non-irradiated area, or damage may occur to a device formed in the circuit board of the chip mounted on the substrate or, in the worst case, the laminated body may be broken.

Solution to Problem

In order to solve such problems, a workpiece-separating device according to the present invention includes: a holding member that detachably holds a workpiece of a laminated body in which the workpiece that includes a circuit board and a supporting body through which laser beams pass are laminated with each other via a separating layer that peelably alters due to at least absorption of the laser beams; a light irradiation part that irradiate the laser beams toward the separating layer through the supporting body of the laminated body held by the holding member; a driving part that relatively moves a light irradiation position of irradiation from the light irradiation part with respect to the supporting body and the separating layer of the laminated body held by the holding member in at least a direction crossing a light irradiation direction of irradiation from the light irradiation part; and a controlling part that operates and controls the light irradiation part and the driving part, wherein the light irradiation part has a laser scanner that moves optical axes of the spot-like laser beams generated by a laser source composed of a laser oscillator, the light irradiation part being configured to perform sweeping on the laminated body, an entire irradiated face of the separating layer irradiated by the light irradiation part is divided into a plurality of irradiation areas, and the controlling part performs control to arrange irradiation of the laser beams, which are irradiated from the light irradiation part onto one irradiation area of the plurality of irradiation areas, in two directions crossing the light irradiation direction by at least an operation of the laser scanner, and after an entirety of one of the plurality of irradiation areas is filled with a multiplicity of the laser beams with no gap, repeatedly perform the irradiation of the laser beams onto a next irradiation area similarly, thereby making all of the plurality of irradiation areas finally irradiated.

Further, in order to solve such problems, a workpiece-separating method according to the present invention includes: a holding process of detachably holding on a holding member a workpiece of a laminated body in which the workpiece that includes a circuit board and a supporting body through which laser beams pass are laminated with each other via a separating layer that peelably alters due to at least absorption of the laser beams; a light irradiation process of irradiating the laser beams from a light irradiation part toward the separating layer through the supporting body of the laminated body held by the holding member; and a relative moving process of relatively moving by a driving part a light irradiation position of irradiation from the light irradiation part with respect to the supporting body and the separating layer of the laminated body held by the holding member in at least a direction crossing a light irradiation direction of irradiation from the light irradiation part, wherein the light irradiation part has a laser scanner that moves optical axes of the spot-like laser beams generated by a laser source composed of a laser oscillator, the light irradiation part being configured to perform sweeping on the laminated body, and in the relative moving process, an entire irradiated face of the separating layer irradiated by the light irradiation part is divided into a plurality of irradiation areas, irradiation of the laser beams from the light irradiation part onto one irradiation area of the plurality of irradiation areas is arranged in two directions crossing the light irradiation direction by at least an operation of the laser scanner, and after the one irradiation are of the plurality of irradiation areas is filled with a multiplicity of the laser beams with no gap, irradiation of the laser beams onto a next irradiation area is repeatedly performed similarly, thereby making all of the plurality of irradiation areas finally irradiated.

DESCRIPTION OF EMBODIMENTS

Figure 1A:
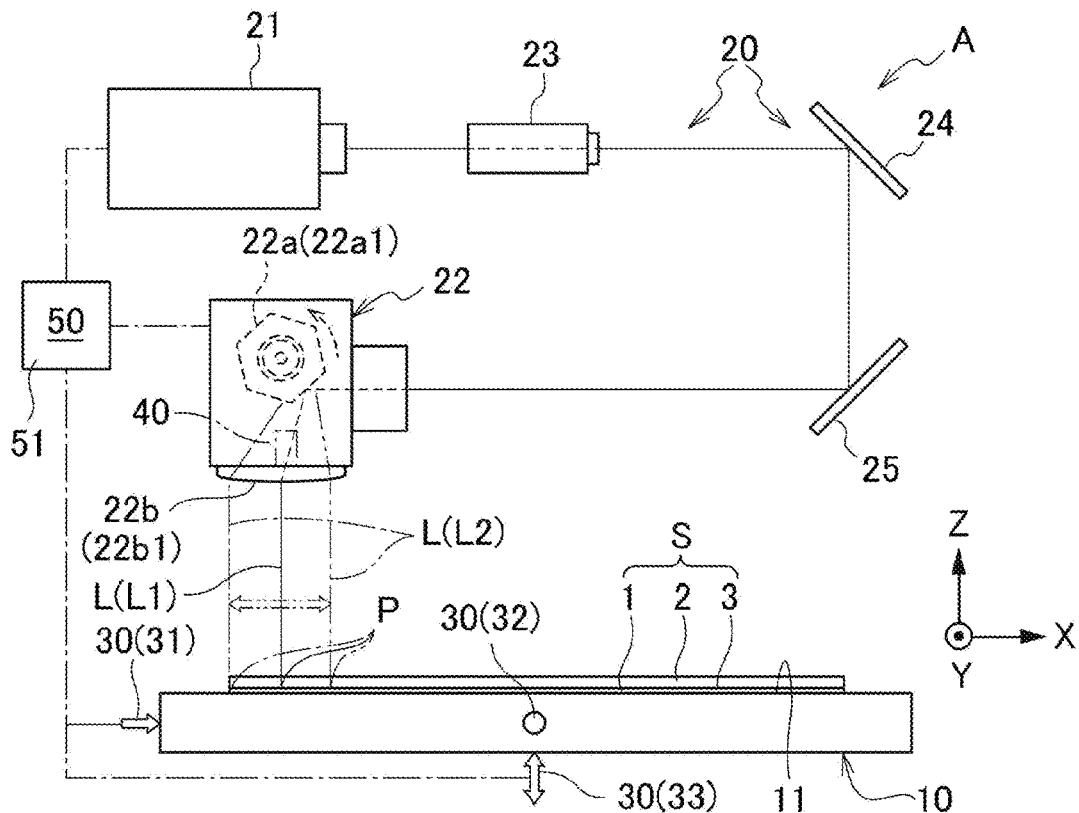
FIG. 1A is an explanatory front view showing the entire configuration of a workpiece-separating device according to an embodiment of the present invention.
Figure 1B:
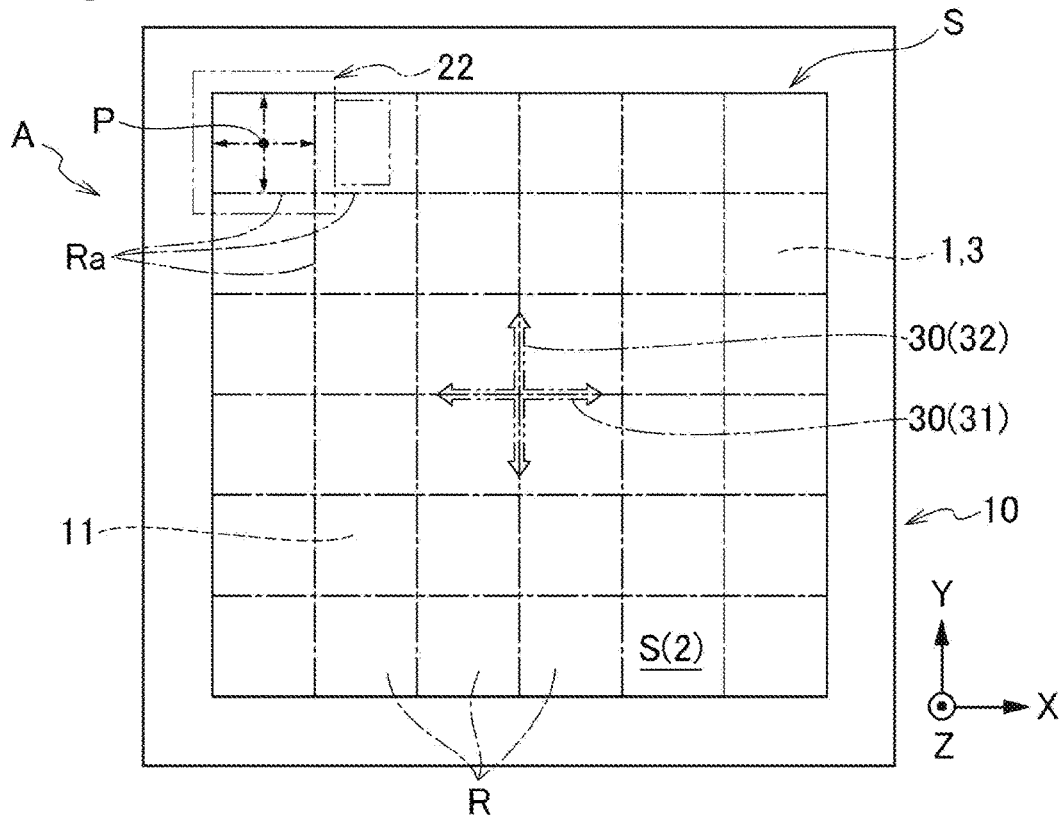
FIG. 1B is an explanatory traverse plan view of the workpiece-separating device of FIG. 1A.

An embodiment of the present invention will be described in detail below on the basis of the drawings.

As shown in FIGS. 1A and 1B to FIGS. 10A and 10B, a workpiece-separating device A and a workpiece-separating method according to the embodiment of the present invention are a device and a method in which laser beams L are irradiated onto a separating layer 3 through a supporting body 2 with respect to a laminated body S, in which a workpiece 1 that includes a circuit board (not shown) and the supporting body 2 that allows the laser beams L to pass therethrough are laminated with each other via the separating layer 3 that peelably alters with at least the absorption of the laser beams L, to peel the supporting body 2 off the workpiece 1. The workpiece-separating device A and the workpiece-separating method are used for manufacturing semiconductor packages or the like as seen in WLP (wafer level packaging) and PLP (panel level packaging) or treatment processes for semiconductor wafers (called "ultrathin wafers" below) having an ultrathin thickness.

More specifically, the workpiece-separating device A according to the embodiment of the present invention includes as its main constituents: a holding member 10 provided to detachably hold the workpiece 1 of the laminated body S; a light irradiation part 22 of an optical system 20 provided to perform the irradiation of the laser beams L from a laser source 21 toward the separating layer 3 through the supporting body 2; and a driving part 30 provided to relatively move a light irradiation position P from the light irradiation part 22 with respect to the supporting body 2 and the separating layer 3. In addition, the workpiece-separating device A preferably includes: a length measuring part 40 provided to measure a distance from the light irradiation part 22 to the irradiated faces of the supporting body 2 and the separating layer 3; and a controlling part 50 provided to perform the operation control of the light irradiation part 22, the driving part 30, the length measuring part 40, or the like.

Note that as shown in FIGS. 1A and 1B to FIGS. 10A and 10B, the laminated body S is generally placed in a vertical direction with respect to the holding member 10, and the laser beams L from the light irradiation part 22 are irradiated downward toward the laminated body S on the holding member 10. The holding direction of the laminated body S with respect to the holding member 10 or the irradiation direction of the laser beams L from the light irradiation part 22 toward the laminated body S will be called a "Z direction" below. The two directions that are relative moving directions by the driving part 30 and cross the irradiation direction (Z direction) of the laser beam L will be called "X and Y directions" below.

The workpiece 1 is a rectangular (panel-shaped) substrate or a circular wafer that includes a circuit board having been subjected to a semiconductor process such as circuit formation treatment and thinning treatment and that is carried in a laminated state in which the workpiece 1 is bonded to the supporting body 2 that will be described later, and is formed into a thin plate shape using a material such as silicon. As a specific example of the workpiece 1, a substrate or a wafer thinned to a thickness of, for example, 15 to 3,000 μm is used. Particularly, when the workpiece 1 has a thickness on the order of several tens of micrometers like an ultrathin wafer or the like, it is also possible to bond the entire face of the workpiece 1 to a tape-like holding adhesive sheet such as a dicing tape to be supported or bond the workpiece 1 to a tape-like holding adhesive sheet with its outer peripheral part reinforced by a ring-like holding frame such as a dicing frame to be supported.

The supporting body 2 is called a support substrate or a carrier substrate having such strength as to support the workpiece 1 in a thinning process, various treatment processes, a carrying process, or the like for the workpiece 1 to prevent the breakage, deformation, or the like of the workpiece 1. The supporting body 2 is formed of a transparent or semi-transparent rigid material such glass and a synthetic resin that allows the laser beams L having a specific wavelength to pass therethrough. As a specific example of the supporting body 2, a transparent or semi-transparent glass plate, ceramic plate, acrylic-based resin plate, or the like having a thickness of, for example, 300 to 3,000 μm is used.

The separating layer 3 is a layer that alters to reduce adhesivity with the absorption of the laser beams L irradiated via the supporting body 2, and that loses an adhesive property and peels or alters to be capable of being destroyed with the reception of a slight external force.

As the material of the separating layer 3, a material that has an adhesive property like, for example, a polyimide resin and makes it possible to bond the workpiece 1 and the supporting body 2 to each other without the interposition of an adhesive layer formed of an adhesive agent is preferably used. In addition, it is also possible to laminate another layer that can be easily cleaned and removed after the supporting body 2 is peeled from the workpiece 1. Further, when the separating layer 3 is formed of a material having no adhesive property, it is required to provide an adhesive layer (not shown) formed of an adhesive agent between the separating layer 3 and the workpiece 1 and adhere the separating layer 3 and the workpiece 1 to each other with the adhesive layer.

The laminated body S is formed into a rectangular (right-angled quadrangle including a rectangle and a square) panel-shape or circular shape that is large in size in the X and Y directions but thin in the Z direction.

An example shown in FIGS. 1A and 1B to FIGS. 3A to 3D and FIGS. 8A and 8B to FIGS. 10A and 10B show the case of the laminated body S having a panel shape in which a rectangular substrate that serves as the workpiece 1 and a rectangular support substrate (carrier substrate) that serves as the supporting body 2 are bonded to each other by the separating layer 3.

An example shown in FIGS. 4A to 4D, FIG. 5, and FIG. 6 show the case of the laminated body S having a circular shape in which a circular wafer that serves as the workpiece 1 and a circular support substrate (carrier substrate) that serves as the supporting body 2 are bonded to each other by the separating layer 3.

Further, particularly when the workpiece 1 has a thickness on the order of several tens of micrometers like an ultrathin wafer, another example includes, although not shown, the laminated body S in a mode in which the workpiece 1 is bonded to a tape-like holding adhesive sheet (dicing tape) with its outer peripheral part reinforced by a ring-like holding frame (dicing frame).

As shown in FIGS. 8A and 8B and FIGS. 10A and 10B, a specific example of the laminated body S includes a panel-type laminated body or the like manufactured by a Fan-out-type PLP technology, in which a sealing body that has a plurality of semiconductor elements Sc mounted on the workpiece 1 and is sealed by a sealing material Sr such as a resin and the panel-shaped supporting body 2 are laminated with each other via the separating layer 3. The sealing body including the plurality of semiconductor elements Sc is finally cut off in the X and Y directions by dicing or the like and then subjected to a final process in which an electrode extraction part is attached via a rewiring layer or the like, whereby a plurality of electronic components are manufactured as final products.

The holding member 10 is composed of a surface plate or the like having such a thickness as not to be distorted (deflected) and deformed by a rigid body such as metal, formed into a substantially rectangular or circular flat-plate shape larger than the outside dimension of the laminated body S and thick, and provided with a holding chuck 11 for the workpiece 1 at its holding face that faces the laminated body S in the Z direction.

The holding chuck 11 is used to contact the workpiece 1 to immovably and detachably hold the same and formed in the entire or a part of the holding face that faces the laminated body S in the Z direction.

As a specific example of the holding chuck 11, an adsorption chuck where the workpiece 1 is adsorbed and held by a differential pressure generated by suction is preferably used. Among adsorption chucks, a porous chuck where the workpiece 1 is adsorbed by a differential pressure through an adsorption face formed of a porous material is particularly preferably used. In the case of a porous chuck, it is possible to adsorb the workpiece 1 by a differential pressure without making the entire workpiece 1 partially deflected. Therefore, a uniform holding state can be maintained.

Further, as another example of the holding chuck 11, it is also possible to use an adhesive chuck or an electrostatic chuck instead of an adsorption chuck or use some of an adsorption chuck, an adhesive chuck, and an electrostatic chuck in combination.

Note that although not shown, another example of the holding member 10 includes a structure in which the entire laminated body S is fixed (immovably and detachably held) via the workpiece 1 by a plurality of support pins instead of a flat-plate-like holding face and a honeycomb surface plate structure. In the case of a structure in which the workpiece 1 is fixed by pins, the workpiece 1 is preferably configured to be capable of being adsorbed and fixed by the tips of a part or the entirety of the plurality of support pins.

The light irradiation part 22 is provided as a part of the optical system 20 that guides the laser beams L from the laser source 21 such as a laser oscillator toward the targeted light irradiation positions P and arranged to face the laminated body S held by the holding member 10 in the Z direction. The light irradiation part 22 has the scanning (sweeping) function of causing the laser beams L guided by the optical system 20 to move along the laminated body S. Thus, the laser beams L guided by the optical system 20 pass through the supporting body 2 of the laminated body S and are irradiated onto the entire face of the separating layer 3.

As the laser beams L irradiated from the light irradiation part 22 toward the laminated body S, laser beams that pass through the supporting body 2 and have a wavelength capable of being absorbed by the separating layer 3 are preferably used.

More specifically, among laser beams L, spot (dot)-like laser beams L that easily achieve higher output laser beams are preferable than laser beams L having a line (slit) shape as their projected shapes. Pulse-oscillated laser beams (pulsed laser beams) L are more preferable than continuously-oscillated laser beams (continuous wave laser) since they are not susceptible to heat caused by laser energy absorbed into the separating layer 3 and give high energy into the separating layer 3.

That is, the light irradiation part 22 is preferably configured to have laser sweeping means (laser scanner) 22a for moving optical axes (main axes) L1 of the spot-like laser beams L generated by the laser source 21 and cause the laser scanner 22a to scan (sweep) the laminated body S with the laser beams L.

As shown in FIGS. 1A and 1B or FIGS. 3A to 3D to FIGS. 10A and 10B, the light irradiation part 22 preferably has the laser scanner 22a that moves the optical axes L1 of the spot-like laser beams L generated by the laser source 21 and a lens 22b that guides the laser beams L from the laser scanner 22a toward the separating layer 3.

As the laser scanner 22a, a polygon scanner 22a1 that rotatably provided, a Galvano scanner 22a2, or the like is used, with such scanners being preferably caused to perform sweeping in any one or both of the X and Y directions crossing the light irradiation direction (Z direction) toward the separating layer 3 from the laser scanner 22a.

The lens 22b has the function of condensing the laser beams L from the laser scanner 22a, and an fθ lens used in combination with the polygon scanner 22a1, the Galvano scanner 22a2, or the like is preferably used. The fθ lens makes it possible to make a scanning speed constant at a lens central part or its peripheral part and put a focal point on a plane.

In addition, as the lens 22b, a telecentric lens 22b1 in which main light beams L2 can be arranged in parallel with the optical axis L1 that passes through a lens center and is perpendicular to a lens face or a non-telecentric lens 22b2 in which the main light beams L2 can be arranged at various angles with respect to the optical axis L1 is preferably used.

Particularly, in the case of the non-telecentric lens 22b2, a lens central part (a lens center and its peripheral portion) at which the irradiation of the laser beams L is stabilized is preferably mainly used, and a lens outer peripheral end at which the irradiation of the laser beams L is not stabilized is not preferably used.

Figure 9A:
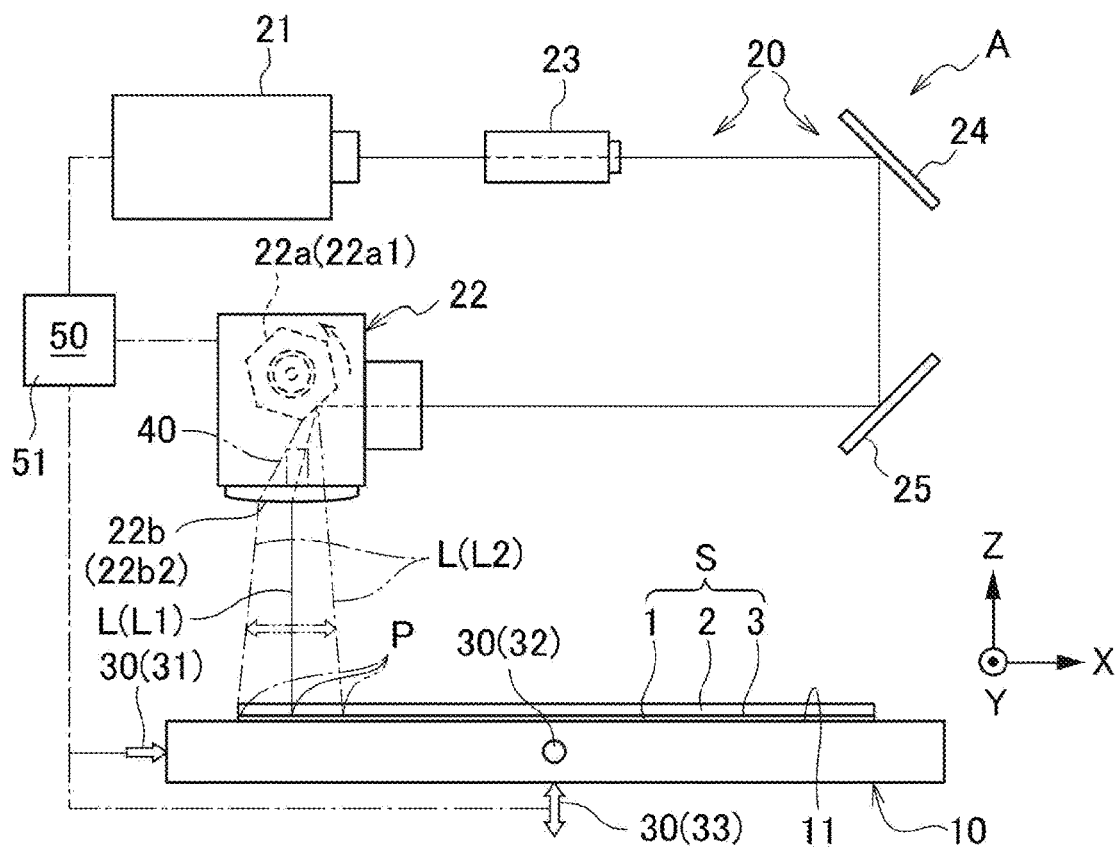
FIGS. 9A and 9B are explanatory front and traverse plan views showing a modified example of the workpiece-separating device according to the embodiment of the present invention.
Figure 9B:
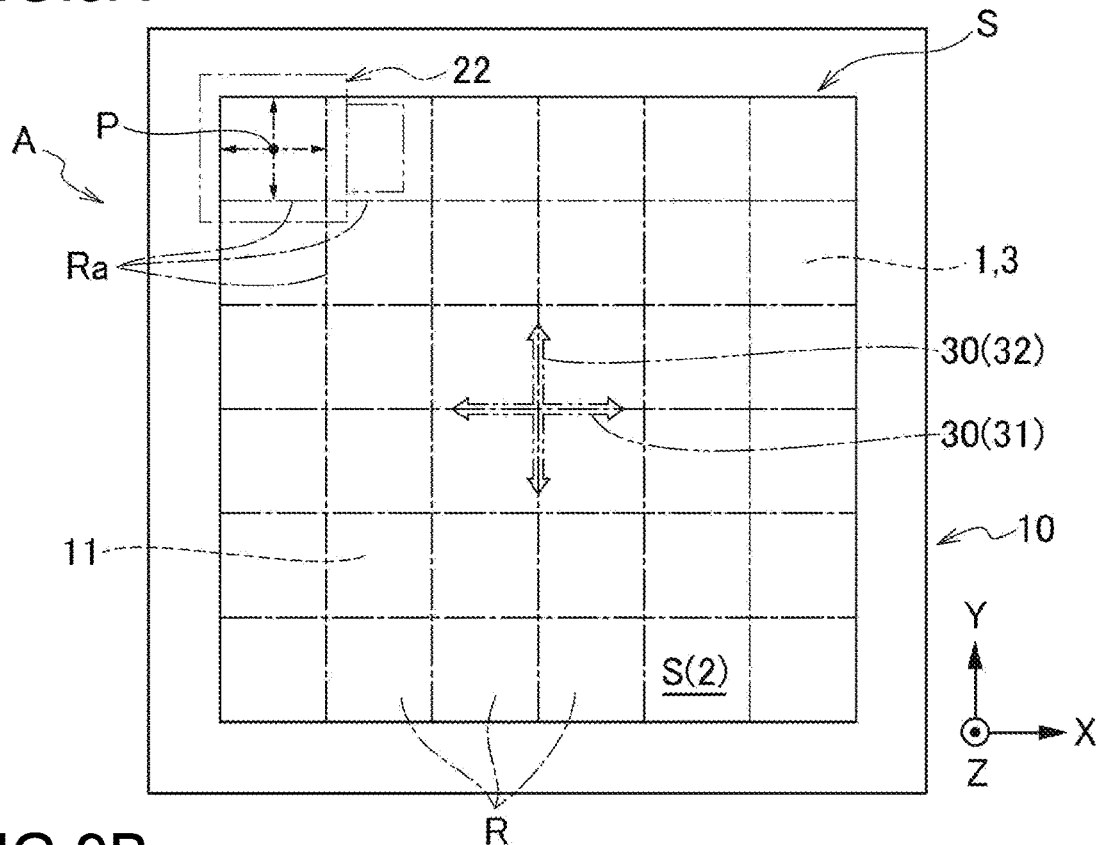

In a case shown in FIG. 1A, FIG. 9A, or the like as a specific example of the optical system 20 and the light irradiation part 22, the beam diameter of the laser beams L generated by a laser oscillator that serves as the laser source 21 is first adjusted through a beam expander 23. Then, the direction of the laser beams L is changed by reflecting mirrors 24 and 25 such as steering mirrors, and the laser beams L are guided to the laser scanner 22a that serves as the light irradiation part 22. Finally, the laser beams L having an ultrashort pulse are irradiated from the laser scanner 22a toward targeted positions of the laminated body S held by the holding member 10 via the lens 22b to perform sweeping.

In a case shown in FIG. 1A, FIGS. 3A to 3D, FIGS. 4A to 4D, and FIGS. 8A and 8B as an example of the laser scanner 22a and the lens 22b, the polygon scanner 22a1 is used as the laser scanner 22a and has a mirror part arranged to have a regular N-sided polygon around a rotationally-driven cylinder. As the lens 22b, the telecentric lens (telecentric fθ lens) 22b1 is used.

The laser beams L incident toward the polygon scanner 22a1 are reflected by colliding with the mirror part and converted into light paths that are substantially perpendicular to or set at a prescribed angle toward the laminated body S via the lens 22b. A sweeping direction in the rotational driving of the mirror part of the polygon scanner 22a1 includes only any one of the X and Y directions. In the example shown in the figures, the laser beams L are moved by a prescribed width in a linear direction parallel to a direction (X direction) in which the laser beams are to be incident on the mirror part having the regular N-side polygon.

Figure 5:
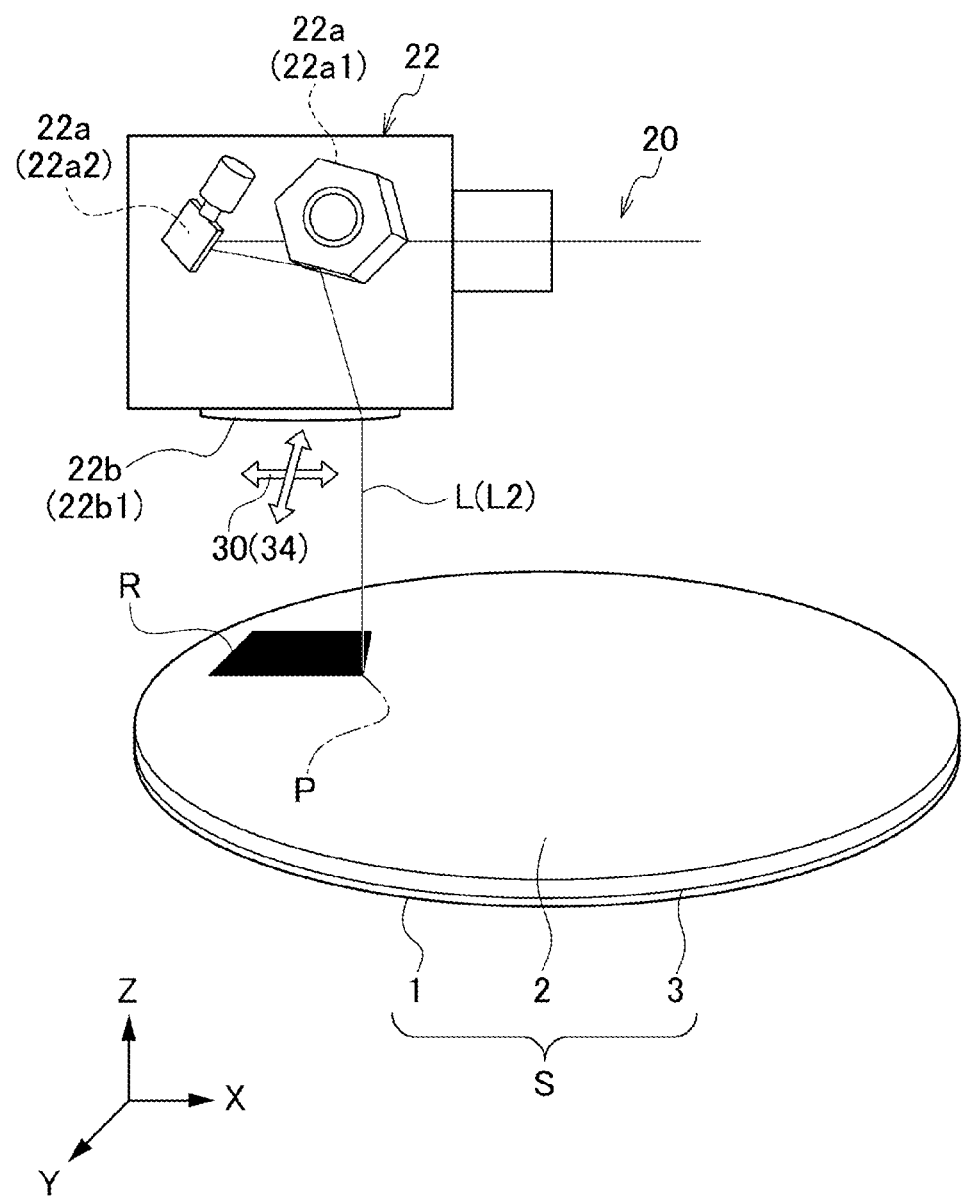
FIG. 5 is an explanatory view showing a modified example of the light irradiation part, FIG. 5 being a partially-cutaway enlarged perspective view showing the process of light irradiation from a scanner.

In a case shown in FIG. 5 as another example of the laser scanner 22*a*, the polygon scanner 22*a*1 and the Galvano scanner 22*a*2 are combined together. In this case, the Galvano scanner 22*a*2 has a reflecting mirror (Galvano mirror) that is rotationally driven. A sweeping direction in the rotational driving of the mirror part of the polygon scanner 22*a*1 and the rotational driving of the reflecting mirror of the Galvano scanner 22*a*2 includes both the X and Y directions.

Figure 6:
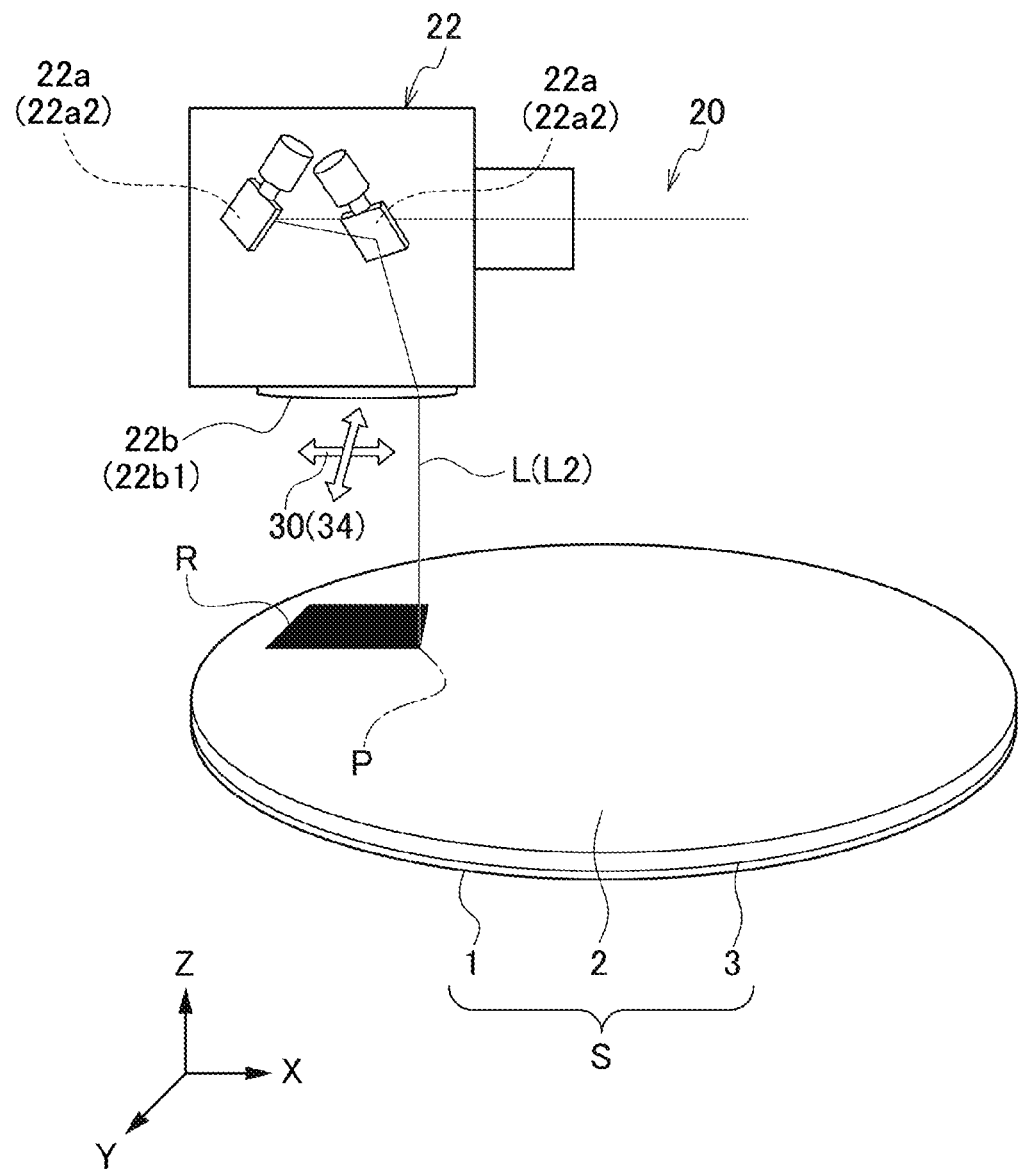
FIG. 6 is an explanatory view showing a modified example of the light irradiation part, FIG. 6 being a partially-cutaway enlarged perspective view showing the process of light irradiation from a scanner.

In addition, in a case shown in FIG. 6 as another example of the laser scanner 22*a*, a plurality of the Galvano scanners 22*a*2 are provided. A sweeping direction in the rotational driving of the reflecting mirrors of the plurality of Galvano scanners 22*a*2 includes both the X and Y directions.

Figure 10A:
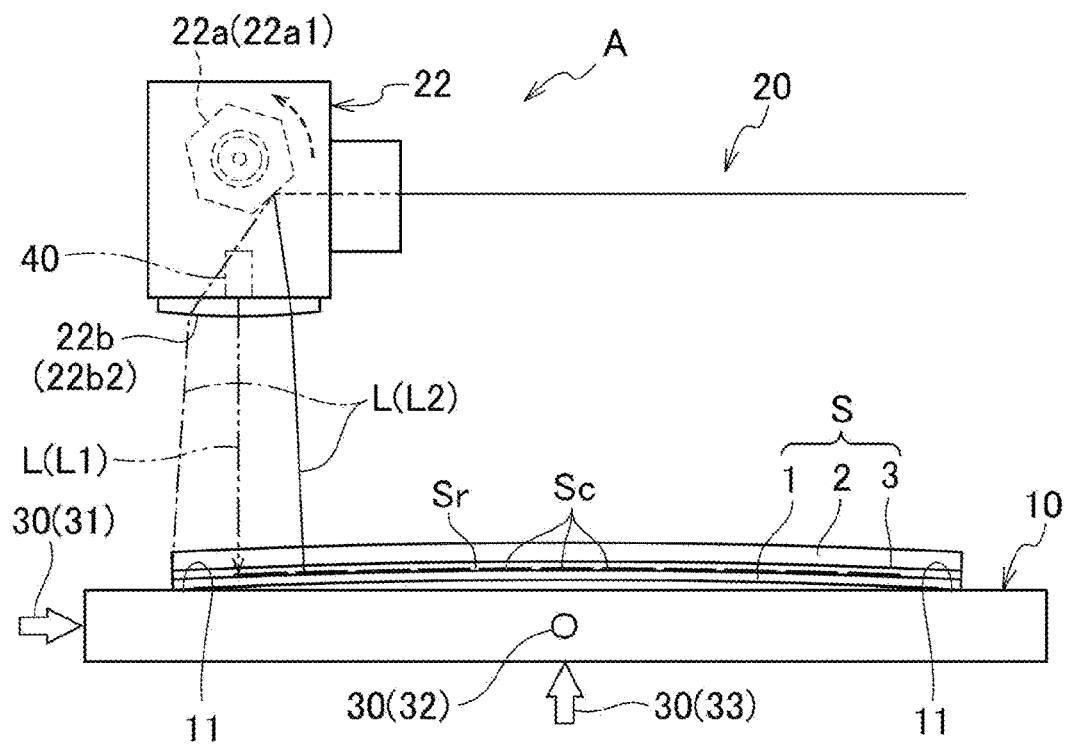
FIGS. 10A and 10B are explanatory views showing an operation state in a case in which a curved laminated body is held, and enlarged front views showing the process of light irradiation from the light irradiation part with respect to the plurality of irradiation areas.
Figure 10B:
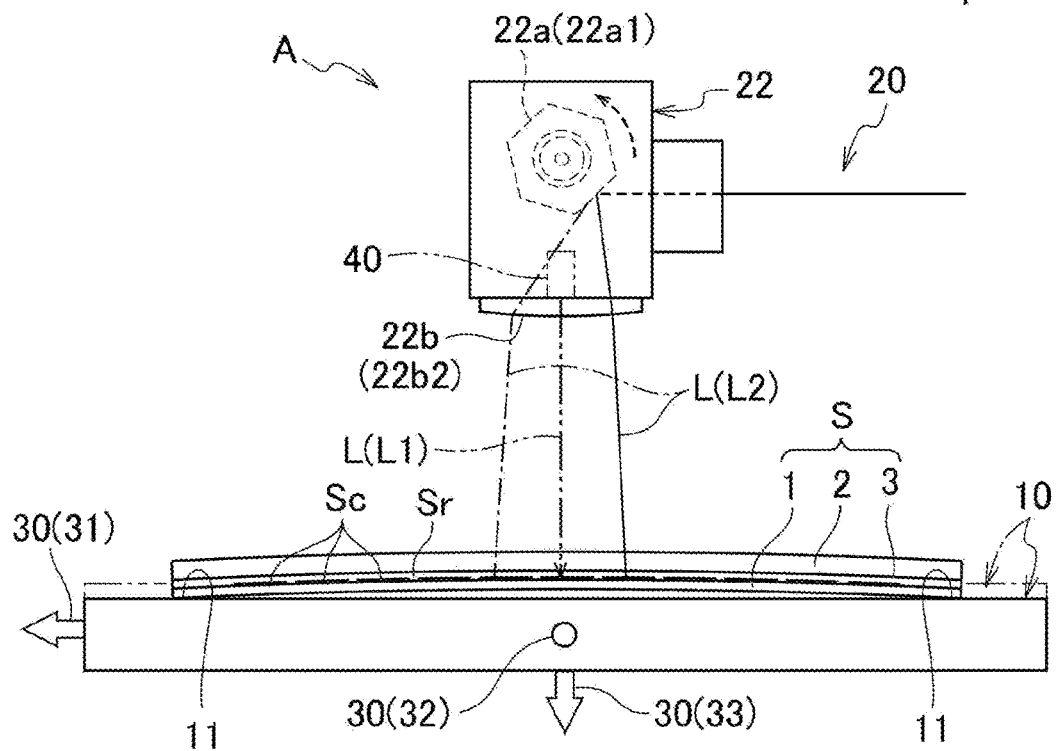

Further, in a case shown in FIG. 9A and FIGS. 10A and 10B as another example of the laser scanner 22*a* and the lens 22*b*, the polygon scanner 22*a*1 is used as the laser scanner 22*a*, and the non-telecentric lens (non-telecentric fθ lens) 22*b*2 is used as the lens 22*b*.

Note that although not shown as another modified example, it is also possible to make a change such as using a scanner having a structure different from that of the polygon scanner 22*a*1 or the Galvano scanner 22*a*2 as the laser scanner 22*a* to perform sweeping in any one or both of the X and Y directions.

Meanwhile, a range in which the laser beams L are capable of being irradiated onto the laminated body S is limited. Therefore, it is difficult to irradiate the laser beams L from the light irradiation part 22 onto the entire separating layer 3 at a time in the laminated body S having a relatively large area.

Further, in order to reliably peel the supporting body 2 off the workpiece 1, it is necessary to uniformly decompose and alter the entire face of the separating layer 3 to such an extent as to be peelable with the energy amounts (energy density) of the laser beams L irradiated onto the separating layer 3 from the light irradiation part 22. The energy amounts necessary for the decomposition and alteration are different depending on the material of the separating layer 3.

Under such circumstances, as described in, for example, Japanese Patent Application Laid-open No. 2012-024783 (PTL2), it is assumed to divide the entire separating layer 3 into a plurality of areas and irradiate the laser beams L onto the divided areas from the light irradiation part 22 one by one (on a one-shot-by-one-shot basis).

However, even where the entire separating layer 3 is only divided into a plurality of irradiation areas, the laser beams L cannot be sufficiently focused on the respective irradiation areas since the irradiation areas are large in size, and the energy amounts (energy density) of the laser beams L irradiated onto the respective irradiation areas do not reach a level at which the entire face of the separating layer 3 is uniformly decomposed. Depending on the material of the separating layer 3, the entire faces of the respective irradiation areas cannot be decomposed uniformly to be altered to such an extent as to be peelable, which results in the occurrence of peeling irregularities.

In view of this, in order to solve such problems, the entire separating layer 3 is divided into a plurality of irradiation areas, and the spot-like laser beams L are aligned and irradiated from the light irradiation part 22 onto the plurality of irradiation areas in the workpiece-separating device A and the workpiece-separating method according to the embodiment of the present invention as shown in FIGS. 1A and 1B to FIGS. 10A and 10B.

Figure 2A:
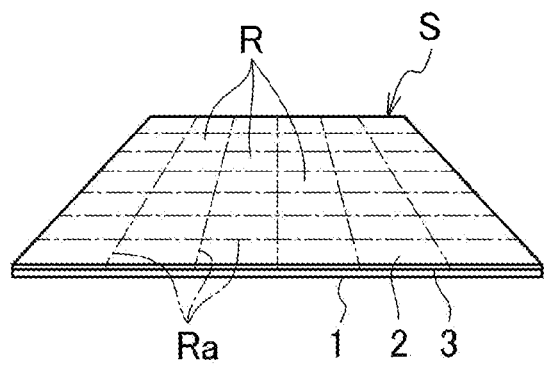
FIGS. 2A and 2B are explanatory perspective views showing the irradiation areas of a separating layer and a difference in size between the plurality of irradiation areas.
Figure 2B:
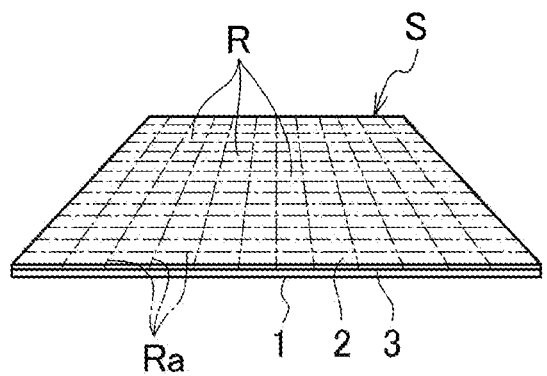

That is, as the areas of the laser beams L irradiated from the light irradiation part 22 onto the supporting body 2 and the separating layer 3 of the laminated body S held by the holding member 10, the entire irradiated face of the separating layer 3 is divided into a plurality of irradiation areas R, and the spot-like laser beams L are aligned and irradiated from the light irradiation part 22 onto the plurality of irradiation areas R for each of the irradiation areas R (for each of unit irradiation areas) as shown in FIGS. 2A and 2B or the like.

More specifically, the plurality of divided irradiation areas R are preferably divided areas having an area smaller than the entire area of the supporting body 2 and the separating layer 3, and the divided respective irradiation areas R preferably have a rectangular shape (a right-angled quadrangle including a square and a rectangle). The divided directions (arrayed directions) of the plurality of irradiation areas R are preferably the X direction and the Y direction same as relative moving directions by the driving part 30 that will be described later, and the size of the plurality of irradiation areas R is preferably set to be adjustable by the controlling part 50 that will be described later. The plurality of divided irradiation areas R are divided areas having a square shape in the example shown in the figures but may be divided areas having a rectangular shape.

Figure 2C:
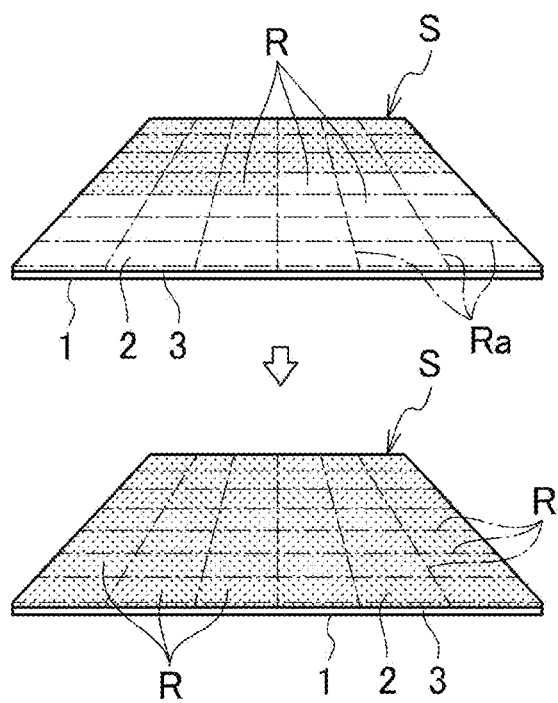
FIGS. 2C and 2D are explanatory perspective views showing the irradiation areas of a separating layer and a difference in irradiation order with respect to the plurality of irradiation areas.
Figure 2D:
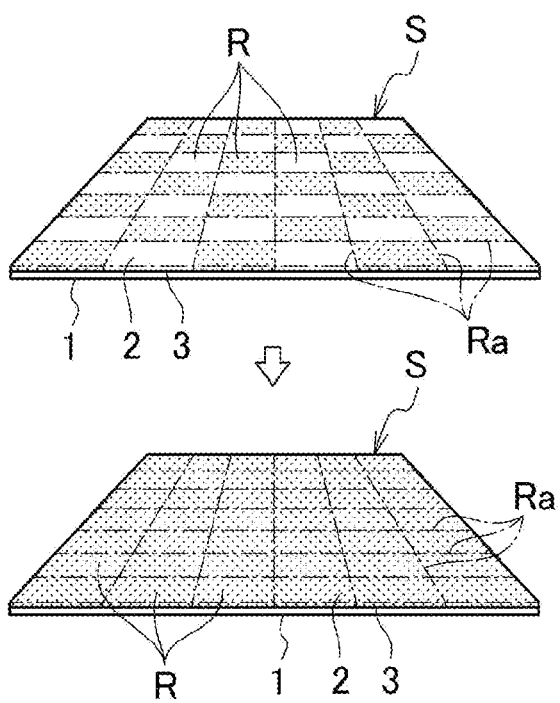
Figure 3A:
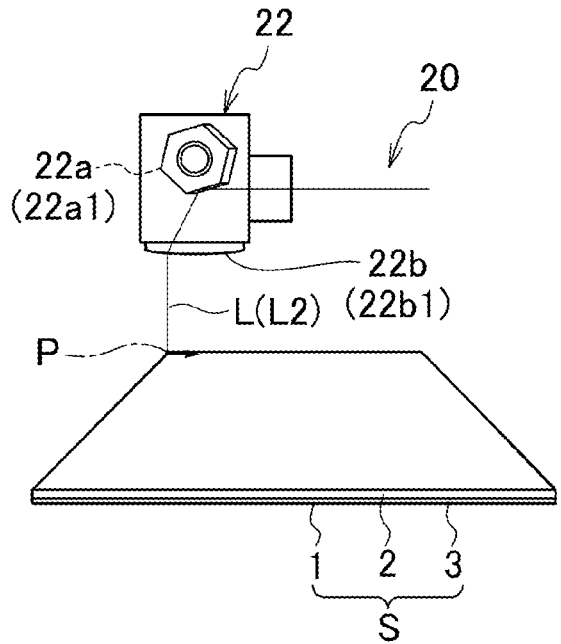
FIGS. 3A, 3B, 3C and 3D are explanatory partially-cutaway perspective views showing a workpiece-separating method and the process of light irradiation from a light irradiation part.
Figure 3B:
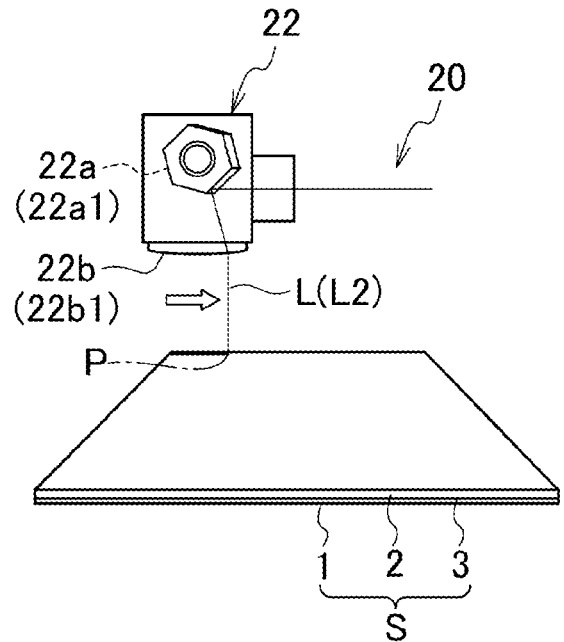
Figure 3C:
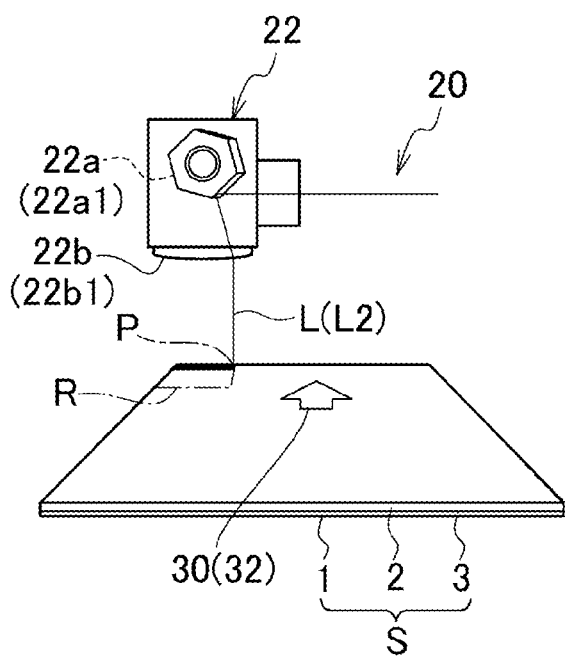
Figure 3D:
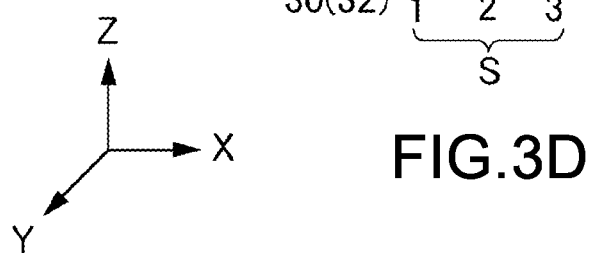
Figure 4A:
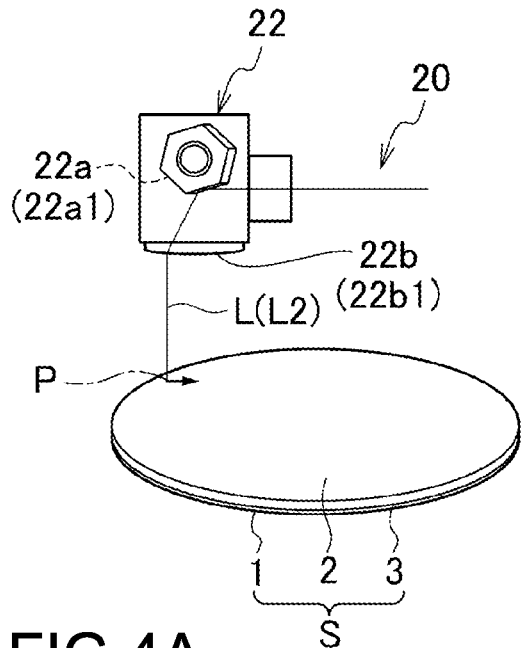
FIGS. 4A, 4B, 4C and 4D are explanatory partially-cutaway perspective views showing a modified example of a laminated body and the process of light irradiation from the light irradiation part.
Figure 4B:
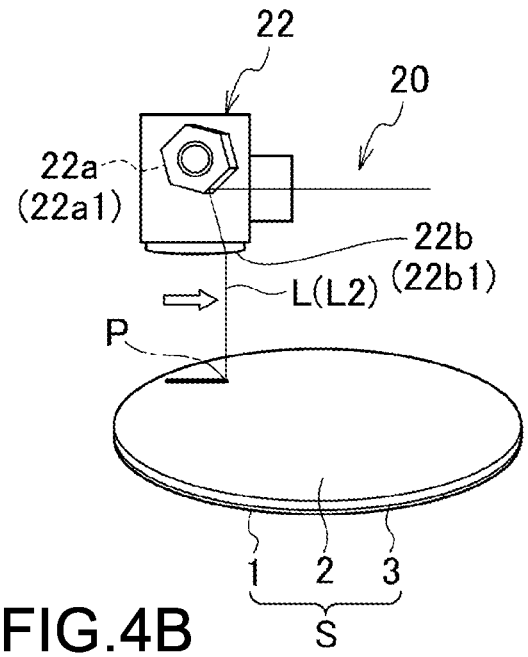
Figure 4C:
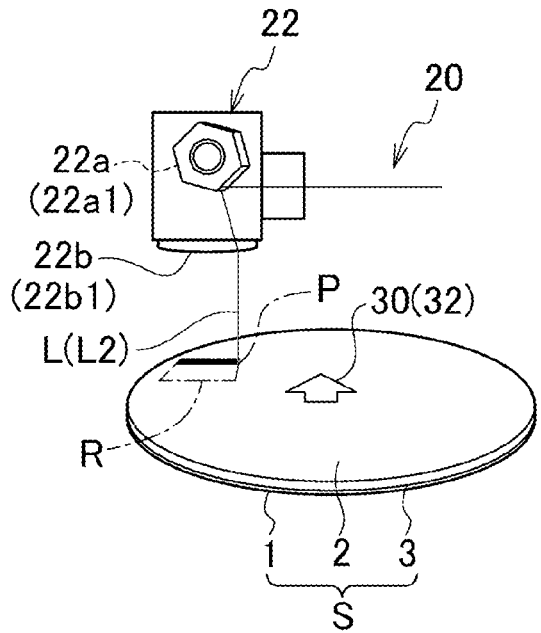
Figure 4D:
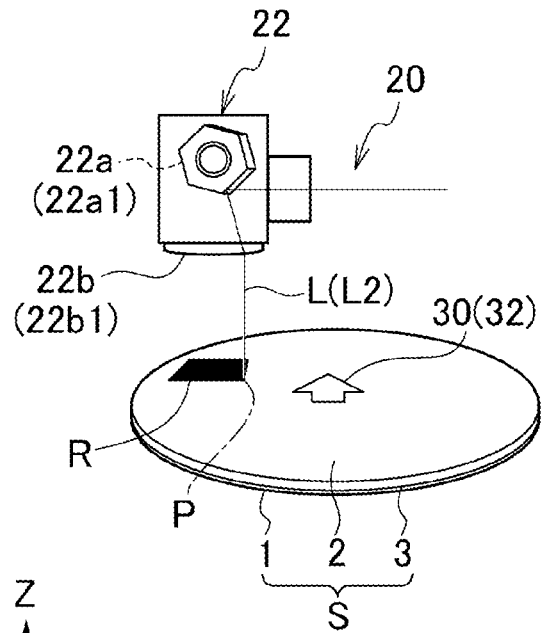

The order in which the laser beams L are irradiated from the light irradiation part 22 onto the plurality of irradiation areas R is preferably set to be adjustable by the controlling part 50 that will be described later, and the laser beams L are preferably irradiated from the light irradiation part 22 onto the respective entire faces of the irradiation areas R in an arbitrarily-set order as shown in FIGS. 2C and 2D.

In addition, as shown in FIG. 1A, FIGS. 3A to 3D or FIGS. 4A to 4D, and FIGS. 8A and 8B, the irradiation angles of the laser beams L irradiated from the light irradiation part 22 toward the laminated body S are preferably set to be substantially perpendicular to the supporting body 2 or the separating layer 3 of the laminated body S held by the holding member 10.

Here, the "substantially perpendicular" is not limited to 90 degrees with respect the face of the supporting body 2 or the separating layer 3 but includes angles in the neighborhood of 90 degrees.

Further, as shown in FIG. 9A and FIGS. 10A and 10B as another example, it is also possible to set the irradiation angles of the laser beams L at prescribed angles with respect to the supporting body 2 or the separating layer 3 of the laminated body S held by the holding member 10.

When the spot-like laser beams L are irradiated from the laser scanner 22*a* of the light irradiation part 22 onto the plurality of irradiation areas R in the separating layer 3 of the laminated body S, the laser beams L having a circular shape, a substantially circular shape, or the like as their beam shape are arranged in the X direction and the Y direction so as to partially overlap each other and successively aligned and irradiated for each of the irradiation areas R by the driving part 30 that will be described later as shown in FIGS. 3A to 3D or FIGS. 4A to 4D or FIG. 7. Thus, one entire irradiation area R among the plurality of irradiation areas R is filled with a multiplicity of the spot-like laser beams L without any gap. After the one entire irradiation area R is filled with a multiplicity of the spot-like laser beams L, the aligned irradiation of the spot-like laser beams L is repeatedly performed on a next irradiation area R in the same manner. Finally, the aligned irradiation of the laser beams L is performed on all the plurality of irradiation areas R.

Figure 7:
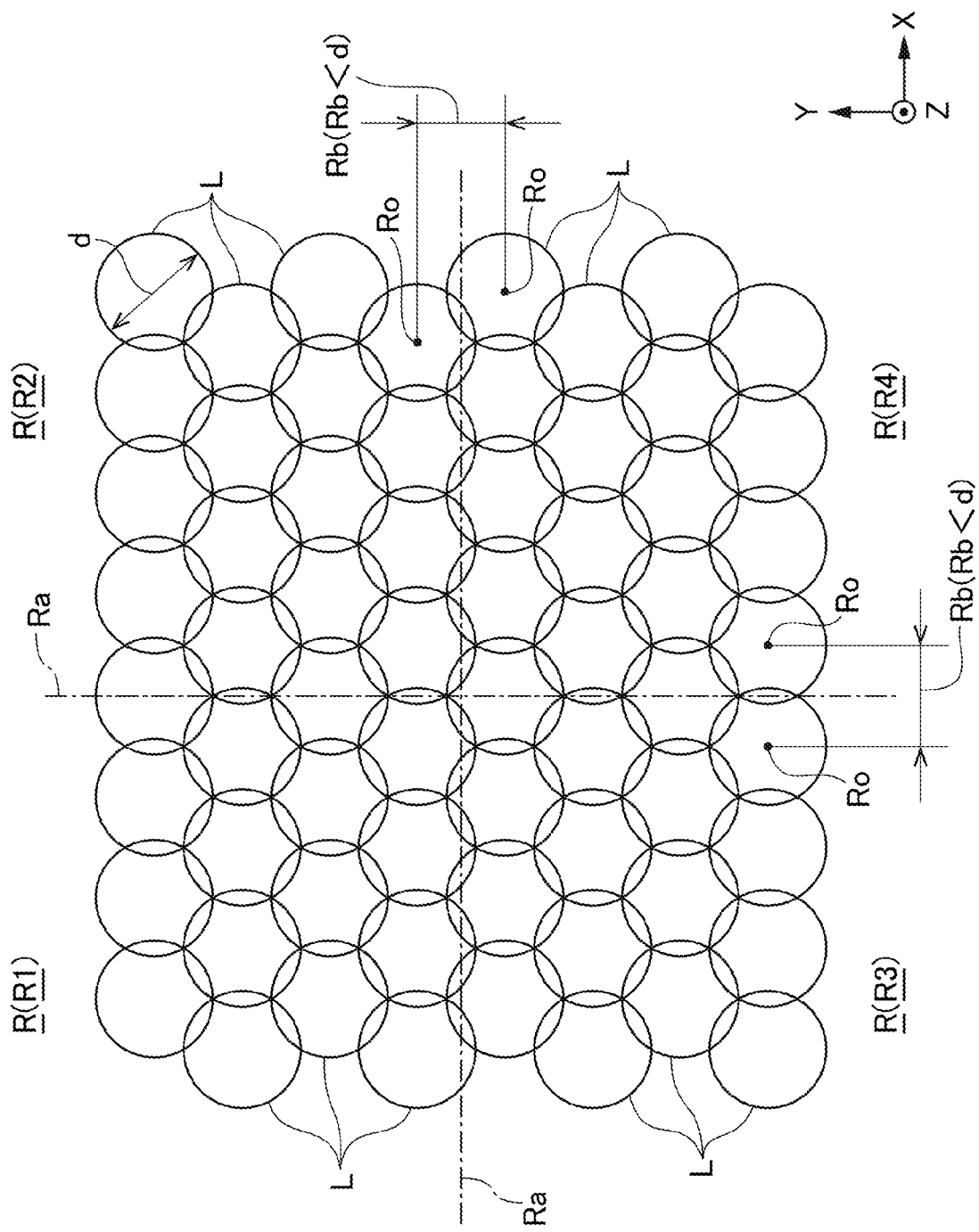
FIG. 7 is a plan view in which the boundaries between the plurality of irradiation areas are partially enlarged.

In addition, as shown in FIG. 7, a distance Rb between the spot-like laser beams L aligned and irradiated with boundaries Ra of the plurality of irradiation areas R interposed therebetween is preferably set to be smaller than a beam diameter d of the laser beams L, and the spot-like laser beams L arranged on the opposite side of the boundaries Ra are preferably aligned and irradiated so as to make their ends contact each other.

The boundaries Ra of the plurality of irradiation areas R are boundary lines formed between adjacent irradiation areas R1, R2, R3, and R4 arrayed in the X direction and the Y direction. The distance Rb at the boundaries Ra is a distance between beam centers Ro of the spot-like laser beams L aligned and irradiated with the boundaries Ra interposed therebetween. Thus, the entire irradiation areas R1, R2, R3, and R4 are filled with a multiplicity of the spot-like laser beams L, and the boundaries Ra of the irradiation areas R1, R2, R3, and R4 are also filled with a multiplicity of the spot-like laser beams L. In a case shown in the example of the figure, the distance Rb between the spot-like laser beams L aligned and irradiated with the boundaries Ra interposed therebetween is set to have the same dimension in each of the X direction and the Y direction as the distance between the spot-like laser beams L aligned and irradiated onto the irradiation areas R1, R2, R3, and R4, and set to make parts of the respective laser beams L similarly overlap each other.

Further, although not shown in the figure as another example, it is also possible to employ a setting other than the example shown in the figure such as making the distance Rb between the spot-like laser beams L aligned and irradiated with the boundaries Ra interposed therebetween different from the distance between the spot-like laser beams L aligned and irradiated onto the irradiation areas R1, R2, R3, and R4.

In addition, when the spot-like laser beams L are irradiated from the laser scanner 22a of the light irradiation part 22 toward the laminated body S, the beam shape (cross-sectional shape) of the respective laser beams L becomes a circular shape or an elliptic shape depending on the irradiation angle of the laser beams L with respect to the laminated body S.

That is, when the irradiation angle of the spot-like laser beams L with respect to the laminated body S is a substantially perpendicular angle (about 90 degrees) in a state in which the laser beams L are irradiated from the laser scanner 22a onto the laminated body S via the lens 22b, the beam shape of the respective laser beams L becomes a circular shape and the beam diameter d of the respective laser beams L becomes the same as shown in FIG. 7.

On the other hand, when the spot-like laser beams L irradiated from the laser scanner 22a onto the laminated body S via the lens 22b are inclined, the irradiation angle with respect to the laminated body S becomes less than a substantially perpendicular angle (about 90 degrees) and a laser irradiation distance from the laser scanner 22a to the laminated body S changes. When the laser beams L are inclined, the beam shape of the respective laser beams L becomes an elliptic shape and at the same time the beam diameter d of the respective laser beams L changes. The beam shape of the spot-like laser beams L is preferably a circular shape rather than an elliptic shape that is unstable as a beam shape.

The reason for it is as follows. When the irradiation angle with respect to the laminated body S from the laser scanner 22a is inclined to be less than a substantially perpendicular angle (about 90 degrees) or when the laminated body S is curved, the beam diameter d of the laser beams L changes with a change in the laser irradiation distance from the laser scanner 22a to the laminated body S. Irradiation energy itself from the laser scanner 22a to the laminated body S does not change. Therefore, when the beam diameter d changes, the energy density of the laser beams L also changes inversely with the square of the beam diameter d.

That is, as described in, for example, Japanese Patent Application Laid-open No. 2012-024783 (PTL2), the oscillation angle of the laser scanner 22a for sweeping increases when the laser beams L are swept from the laser scanner 22a toward the entire irradiation areas divided at a relatively large size. Therefore, irradiation energy density is made different between the center and the end of the irradiation areas, which results in a possibility that peeling irregularities occur.

On the other hand, when the oscillation angle of the laser scanner 22a for sweeping is limited to a small angle toward the irradiation areas divided at a relatively small size, the irradiation energy density becomes uniform. As a result, it is possible to prevent the occurrence of peeling irregularities.

The driving part 30 is an optical-axis relative moving mechanism that is configured to move one or both of the holding member 10 and the light irradiation part 22 to relatively move the laser beams L irradiated from the light irradiation part 22 in at least two directions (the X and Y directions) crossing the irradiation direction (the Z direction) of the laser beams L from the light irradiation part 22 with respect to the supporting body 2 and the separating layer 3 of the laminated body S held by the holding member 10.

The relative moving direction by the driving part 30 is not limited to the X and Y directions but includes the Z direction as required.

The optical-axis relative moving mechanism that serves as the driving part 30 includes a workpiece-side moving type that mainly moves the holding member 10 and the laminated body S and an optical-axis-side moving type that moves the light irradiation part 22.

In the case of the workpiece-side moving type, the driving part 30 is provided in the holding member 10 as shown in FIGS. 1A and 1B and FIGS. 8A and 8B or FIGS. 9A and 9B and FIGS. 10A and 10B. The driving part 30 moves the holding member 10 in the X direction and Y directions or the Z direction to move the light irradiation positions P of the light irradiation part 22 in the X and Y directions or the Z direction. In this case, an XY stage, an XY table, or the like is used as the driving part 30, and the driving part 30 has an X-axis moving mechanism 31 and a Y-axis moving mechanism 32 composed of a motor shaft or the like. In addition, a Z-axis moving mechanism 33 that moves the holding member 10 in the Z direction is preferably provided as required.

In a case shown in FIGS. 1A and 1B and FIGS. 8A and 8B or FIGS. 9A and 9B and FIGS. 10A and 10B as a specific example of the driving part 30, the holding member 10 is moved in the X and Y directions or the Z direction, besides scanning (sweeping) in the X direction of the laser beams L based on the rotational driving of the laser scanner (polygon scanner) 22a.

Further, in the case of the optical-axis-side moving type, the driving part 30 is provided in only a part of the optical system 20 as shown in FIG. 5 or FIG. 6, and the optical-axis-side moving type is configured to move the light irradiation positions P of the light irradiation part 22 in the X and Y directions or the Z direction without the movement of the holding member 10. In this case, the driving part 30 has an XY-axis moving mechanism 34 composed of the polygon scanner 22a1, the Galvano scanner 22a2, or the like. In order to cause the light irradiation positions P to relatively move in the Z direction as required, a Z-axis moving mechanism 33 is provided in the holding member 10 although not shown in the figure or the light irradiation part (laser scanner) 22 is moved in the Z direction by the driving part 30.

The length measuring part 40 is composed of a non-contact-type displacement gauge, a non-contact-type displacement sensor, or the like that measures an irradiation distance from the light irradiation part 22 to the irradiated face of the supporting body 2 or the separating layer 3 of the laminated body S held by the holding member 10, and is arranged to face the laminated body S held by the holding member 10 in the Z direction. In a case shown in FIGS. 1A and 1B and FIGS. 8A and 8B or FIGS. 9A and 9B and FIGS. 10A and 10B as a specific example of the length measuring part 40, a laser displacement gauge that serves as the length measuring part 40 is provided in the light irradiation part (laser scanner) 22, a length in the Z direction from the light irradiation part (laser scanner) 22 to the irradiated face of the separating layer 3 is measured, and the measurement value is output to the controlling part 50 that will be described later.

Further, although not shown in the FIG.ures as another example, it is also possible to use a displacement gauge or a displacement sensor other than a laser displacement gauge as the length measuring part 40.

The controlling part 50 is a controller electrically connected to each of the driving source of the holding chuck 11 of the holding member 10, the optical system 20, the laser source 21, the light irradiation part 22, the optical-axis relative moving mechanism that serves as the driving part 30, and the length measuring part 40.

In addition, the controlling part 50 is a controller electrically connected also to a carry-in mechanism (not shown) that carries the laminated body S before separation toward the holding member 10, a peeling mechanism (not shown) that holds only the supporting body 2 and peels the same off the laminated body S after light irradiation, a carry-out mechanism (not shown) that carries the laminated body S (workpiece 1) after peeling from the holding member 10, or the like.

The controller that serves as the controlling part 50 successively controls each operation at a prescribed timing according to a program set in advance in its control circuit (not shown). That is, the controlling part 50 performs not only the general operation control of the workpiece-separating device A including the ON/OFF control of the laser beams L irradiated at the light irradiation positions P from the laser source 21 but also various settings such as the setting of the various parameters of the laser beams L.

By the controlling part 50, the light irradiation part 22 of the optical system 20 or the driving part 30 is caused to perform the irradiation of the laser beams L from the light irradiation part 22 for each of the irradiation areas R with respect to the plurality of irradiation areas R obtained by dividing the supporting body 2 and the separating layer 3 of the laminated body S held by the holding member 10 and perform control to make the irradiation angles of the laser beams L substantially perpendicular to or set at prescribed angles with respect to the face of the supporting body 2 or the separating layer 3.

Besides this, the controller that serves as the controlling part 50 has input means 51, a displaying part (not shown), or the like such as a touch panel and is configured to be capable of setting the scanning distance of the light irradiation part 22, the size of the plurality of irradiation areas R, the irradiation order of the laser beams L from the light irradiation part 22 onto the plurality of irradiation areas R, or the like according to the operation of the input means 51.

In the irradiation order of the laser beams L from the light irradiation part 22 onto the plurality of irradiation areas R that is set in the controlling part 50, "continuous irradiation" or "discontinuous irradiation" is performed with respect to the plurality of irradiation areas R arrayed in the X direction and the Y direction in cooperation with relative movement in the X and Y directions by the driving part 30 as shown in FIGS. 2A and 2B, and the laser beams L are finally irradiated onto all the plurality of irradiation areas R. Note that the presence or absence of the irradiation is indicated by shading in the figures. The irradiation areas R before the irradiation are displayed in a light color, while the irradiation areas R after the irradiation are displayed in a dark color.

In a case shown in FIG. 2C as the "continuous irradiation", the laser beams L are irradiated onto one row of the irradiation areas R, which are arranged in any one of the X direction and the Y direction from the irradiation area R arranged at a corner portion corresponding to the end of the laminated body S, in an order in which the irradiation areas R that are precedingly (previously) irradiated and the irradiation areas R that are subsequently irradiated are continuous. After the irradiation of the laser beams L onto the one row, the laser beams L are also similarly irradiated onto another row. In an example shown in the figure, the laminated body S held by the holding member 10 is moved by one row in the Y direction by the driving part 30 after the laser beams L are successively and continuously irradiated onto one row of the irradiation areas R arranged in the X direction, and then the laser beams L are continuously similarly irradiated onto another row.

In a case shown in FIG. 2D as the "discontinuous irradiation", the laser beams L are irradiated onto one row of the irradiation areas R, which are arranged in any one of the X direction and the Y direction, in an order in which the irradiation areas R that are precedingly (previously) irradiated and the irradiation areas R that are subsequently irradiated are separated. After the irradiation of the laser beams L onto one row of the irradiation areas R, the laser beams L are also irradiated onto another row similarly. Other than the above point, the discontinuous irradiation is performed in the same manner as the "continuous irradiation". In an example shown in the figure, the laser beams L are irradiated so as to form a zigzag pattern in an alternate manner in the X direction and the Y direction, and the irradiated irradiation areas R are controlled so as not to be adjacent to each other in the X direction and the Y direction.

Further, although not shown in the figures as another example, it is also possible to employ irradiation orders other than those shown in the figures such as performing the "continuous irradiation" or the "discontinuous irradiation" on one row of the plurality of irradiation areas R arranged in the Y direction and performing the irradiation of the laser beams L every a plurality of (two) irradiation areas R in the "discontinuous irradiation".

Next, the program set in the control circuit of the controlling part 50 will be described as the workpiece-separating method of the workpiece-separating device A.

The workpiece-separating method using the workpiece-separating device A according to the embodiment of the present invention includes as its main processes: a holding process of detachably holding the workpiece 1 of the laminated body S on the holding part 10; a light irradiation process of irradiating the laser beams L from the light irradiation part 22 toward the separating layer 3 through the supporting body 2 of the laminated body S held by the holding member 10; a relative moving process of relatively moving the light irradiation positions P of the light irradiation part 22 with respect to the supporting body 2 and the separating layer 3 of the laminated body S held by the holding member 10; and a separation process of peeling the supporting body 2 off the workpiece 1 of the laminated body S.

In addition, as processes subsequent to the separation process: a cleaning process of removing a residue of the separating layer 3 remaining on the workpiece 1 having been separated from the separating layer 3 with a cleaning liquid; and a cutting-off process of cutting off the workpiece 1 after the cleaning process with dicing or the like may be included.

In the holding process, the laminated body S before separation is carried in toward the holding member 10 by the operation of the carry-in mechanism (not shown) composed of a carrying robot or the like, and immovably held by the holding chuck 11 at a prescribed position on the holding face of the holding member 10.

In the light irradiation process, the laser beams L are irradiated by the operations of the optical system 20 and the light irradiation part 22 onto the separating layer 3 through the supporting body 2 toward the laminated body S held by the holding member 10.

In the relative moving process, the laminated body S held by the holding member 10 and the light irradiation part 22 are relatively moved in the X and Y directions or the Z direction by the operation of the driving part 30 or the light irradiation part (laser scanner) 22.

In a case shown in FIGS. 1A and 1B through FIGS. 4A to 4D, and FIGS. 9A and 9B the supporting body 2 and the separating layer 3 of the laminated body S held by the holding member 10 are relatively moved in the X and Y directions with respect to the laser scanner 22a that serves as the light irradiation part 22 by the operation of the driving part 30. Further, in a case shown in FIG. 5 or FIG. 6, the laser scanner 22a that serves as the light irradiation part 22 is relatively moved in the X and Y directions with respect to the supporting body 2 and the separating layer 3 of the laminated body S held by the holding member 10 by the operation of the driving part 30. Thus, the spot-like laser beams L are aligned and irradiated from the laser scanner 22a of the light irradiation part 22 for each of the irradiation areas R with respect to the plurality of irradiation areas R divided to be smaller than the entire irradiated faces of the supporting body 2 and the separating layer 3. Concurrently with this, the irradiation angles of the spot-like laser beams L aligned and irradiated from the laser scanner 22a of the light irradiation part 22 for each of the irradiation areas R are held to be substantially perpendicular or set at prescribed angles. Finally, the laser beams L are irradiated onto all the plurality of irradiation areas R.

Thus, the laser beams L are uniformly irradiated for each of the unit irradiation areas R. Therefore, the laser beams L are finally irradiated over the entire face of the separating layer 3 without causing irradiation irregularities, and the entire face of the separating layer 3 alters to make the workpiece 1 and the supporting body 2 peelable.

In the separation process, the supporting body 2 is peeled and separated from the workpiece 1 of the laminated body S held by the holding member 10 by the operation of the peeling mechanism (not shown) that holds and peels the supporting body 2 off the laminated body S after light irradiation.

After the separation process, the workpiece 1 after the separation is removed from the holding face of the holding member 10 and carried out by the operation of the carrying-in mechanism (not shown) composed of the carrying robot or the like.

After that, the above processes are repeatedly performed.

Further, in a case in which the laminated body S is curved as shown in FIGS. 8A and 8B or FIGS. 10A and 10B, the Z-axis moving mechanism 33 is operated and controlled on the basis of measurement values measured by the length measuring part 40 so that an irradiation distance from the light irradiation part 22 to the plurality of irradiation areas R becomes substantially constant when the spot-like laser beams L are aligned and irradiated from the laser scanner 22a of the light irradiation part 22 for each of the plurality of irradiation areas R.

As a specific control example, the representative points of the respective irradiation areas R facing the light irradiation part 22 in the Z direction are measured by the length measuring part 40 to detect measurement values before the light irradiation of the light irradiation part 22, and the Z-axis moving mechanism 33 is operated and controlled in synchronization with timings at which the light irradiation of the respective irradiation areas R is performed on the basis of the measurement values. That is, the holding member 10 is moved in the Z direction by the operation control of the Z-axis moving mechanism 33 to adjust an irradiation distance from the laser scanner 22a of the light irradiation part 22 to the plurality of irradiation areas R.

Further, as another example, it is also possible to move the holding member 10 in the Z direction by operating and controlling the Z-axis moving mechanism 33 while feeding back measurement values measured by the length measuring part 40.

Thus, it is possible to make an adjustment so that the irradiation distance between the separating layer 3 of the curved laminated body S held by the holding member 10 and the laser scanner 22a of the light irradiation part 22 becomes substantially constant.

In the workpiece-separating device A and the workpiece-separating method according to the embodiment of the present invention, the spot-like laser beams L are irradiated from the light irradiation part 22 onto the separating layer 3 through the supporting body 2 of the laminated body S toward the laminated body S held by the holding member 10.

As the holding member 10 and the light irradiation part 22 are relatively moved in the two directions (X and Y directions) by the driving part 30, the spot-like laser beams L are aligned and irradiated from the laser scanner 22a of the light irradiation part 22 onto the plurality of irradiation areas R, which are obtained by dividing the entire irradiated face of the separating layer 3, for each of the irradiation areas R (for each of the unit irradiation areas).

Thus, the laser beams L are uniformly irradiated for each of the unit irradiation areas R. Finally, the laser beams L are irradiated onto all the plurality of irradiation areas R without causing irradiation irregularities, and the entire face of the separating layer 3 alters to make the workpiece 1 and the supporting body 2 peelable.

Accordingly, the laser beams L can be uniformly irradiated regardless of the size of the laminated body S or the thickness of the workpiece 1 to easily peel the supporting body 2 off the workpiece 1.

As a result, compared with a conventional case in which the partial irradiation irregularities of laser beams easily occur in the separating layer of a laminated body, the laser beams L can be uniformly irradiated onto the entire large area of the separating layer 3 through the supporting body 2 even if the workpiece 1 is thin and large in size (has a large area). Therefore, a partial peeling failure does not occur, and the output of the laser beams L does not become too strong. As a result, the occurrence of damage to a device formed in the circuit board of the workpiece 1 or the occurrence of soot due to partial excessive irradiation is prevented.

Further, unlike a conventional case in which depending on the material of the separating layer 3, the entire faces of the respective irradiation areas cannot be decomposed uniformly to be altered to such an extent as to be peelable, the supporting body 2 can be reliably peeled from the workpiece 1 regardless of the material of the separating layer 3.

In addition, even the laminated body S that is curved can be uniformly peeled. Therefore, the supporting body 2 can be separated from the workpiece 1 with high accuracy, and a high-performance and clean product is manufactured.

Particularly, the light irradiation part 22 preferably has the lens 22b that guides the laser beams L from the laser scanner 22a toward the separating layer 3, and the lens 22b is preferably the telecentric lens 22b1 in which the main light beams L2 are arranged in parallel with the optical axis L1 of the lens 22b or the non-telecentric lens 22b2 in which the main light beams L2 are arranged at prescribed angles with respect to the optical axis L1.

Figure 8A:
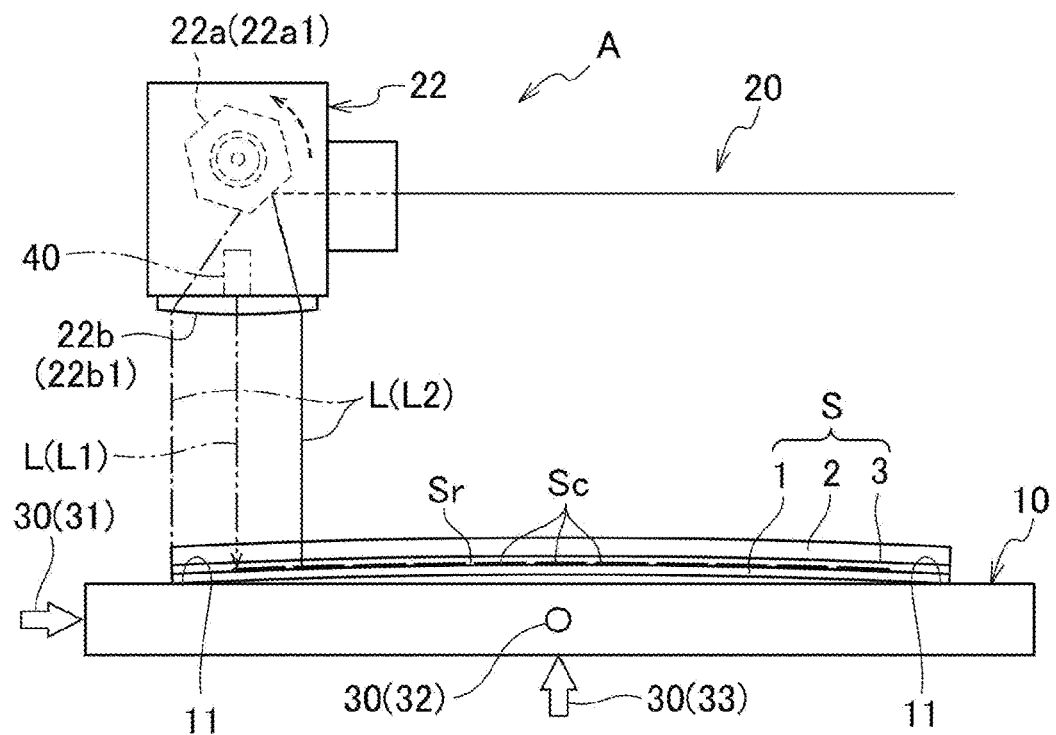
FIGS. 8A and 8B are explanatory views showing an operation state in a case in which a curved laminated body is held, and enlarged front views showing the process of light irradiation from the light irradiation part with respect to the plurality of irradiation areas.
Figure 8B:
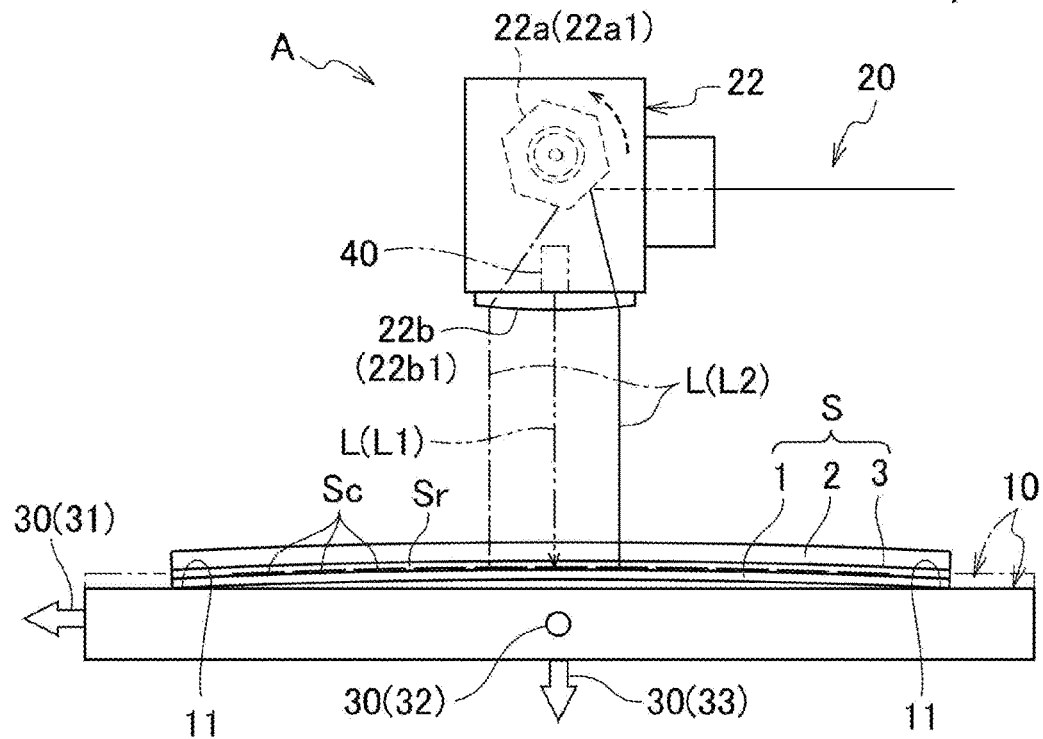

In the case of the telecentric lens 22b1 shown in FIG. 1A or FIGS. 8A and 8B, an irradiation angle with respect to the laminated body S becomes a substantially perpendicular angle. Therefore, the beam shape (cross-sectional shape) of the laser beams L does not become an elliptic shape. As a result, it is possible to arrange circular beam shapes as the laser beams L over the entire face of the separating layer 3.

Accordingly, the separating layer 3 can be more uniformly peeled by the laser beams L.

As a result, higher-quality laser peeling can be performed even if the workpiece 1 is large in size (has a large area).

In addition, the separating layer 3 that is a constituting material having angle dependence in which the absorption rate of the laser beams L is largely different depending on the incident angles of the laser beams L is effective.

Further, in the case of the non-telecentric lens 22b2 shown in FIG. 9A or FIGS. 10A and 10B, a substantially circular beam shape is obtained even if an irradiation distance from the laser scanner 22a to the separating layer 3 slightly changes, and the beam shape (cross-sectional shape) of the laser beams L hardly changes even if the position of the separating layer 3 moves in the irradiation direction of the laser beams L due to the curvature of the separating layer 3. Particularly, when the size of the plurality of irradiation areas R is relatively small, the beam shape of the laser beams L does not become an elliptic shape. As a result, it is possible to perform stabilized peeling.

Accordingly, even if the separating layer 3 is curved, the laser beams L can be uniformly irradiated to reliably peel the supporting body 2 off the workpiece 1.

Therefore, the supporting body 2 can be separated from the curved workpiece 1 with high accuracy, and a high-performance and clean product is manufactured.

In addition, as shown in FIGS. 1A and 1B, FIGS. 9A and 9B, or the like, the driving part 30 preferably has the X-axis moving mechanism 31 and the Y-axis moving mechanism 32 that relatively move, with respect to the light irradiation part 22, the holding member 10 in the two directions (X and Y directions) crossing the light irradiation direction (Z direction) from the light irradiation part 22.

In this case, the laminated body S held by the holding member 10 is moved in the two directions (X and Y directions) crossing the light irradiation direction (Z direction) by the operations of the X-axis moving mechanism 31 and the Y-axis moving mechanism 32. Therefore, it is possible to irradiate the laser beams L over the entire face of the separating layer 3 without moving the optical system 20 including the light irradiation part 22.

Accordingly, the laser beams L can be uniformly irradiated onto the separating layer 3 of the laminated body S by a simple structure to easily peel the supporting body 2 off the workpiece 1.

As a result, the structure of the entire device can be simplified to reduce a manufacturing cost.

Further, as shown in FIG. 7, the distance Rb between the laser beams L irradiated with the boundaries Ra of the plurality of irradiation areas R interposed therebetween is preferably set to be smaller than the beam diameter d of the laser beams L.

In this case, the laser beams L arranged on the opposite side of the boundaries Ra are irradiated so as to make their ends contact each other. Therefore, the irradiation of the laser beams L does not partially become insufficient.

Accordingly, the occurrence of a partial peeling failure can be prevented even at the boundaries Ra of the plurality of irradiation areas R.

As a result, the plurality of irradiation areas R can be uniformly peeled as a whole to manufacture a high-performance product.

Further, as shown in FIG. 2D, the controlling part 50 preferably performs control so that the laser beams L are irradiated in an order in which the irradiation areas R that are precedingly irradiated and the irradiation areas R that are subsequently irradiated are separated as the irradiation order of the laser beams L from the light irradiation part 22 onto the plurality of irradiation areas R.

In this case, when the laser beams L are irradiated in an order in which the irradiation areas R that are precedingly irradiated and the irradiation areas R that are subsequently irradiated are separated, stress is individually released in the adjacent irradiation areas R but each stress is minute. Therefore, an influence is small.

Accordingly, internal stress due to the curvature is not locally released during irradiation, and the entire face can be peeled.

As a result, the occurrence of cracks in an interface with the irradiation areas R that have not been irradiated or damage to a device formed in the circuit board of the workpiece 1 can be prevented, and the breakage of the laminated body S can be completely prevented to improve yields.

Particularly, when the entire laminated face of the separating layer 3 is divided into rectangular areas continuous over both ends of the separating layer 3 as the plurality of irradiation areas R, a tact time can be shortened compared with that of square areas and the stress occurring between the irradiated portions and the non-irradiated portions of the laser beams L can be easily released. Therefore, even in a case in which cracks occur in the workpiece 1 due to stress in a peeling direction depending on the irradiation condition of the laser beams L or the condition of a material used in the bonding portion or the like between the workpiece 1 and the separating layer 3 and a case in which soot occurs at the bonding portion between the workpiece 1 and the separating layer 3 acting with the laser beams L depending on the irradiation condition of the laser beams L or the condition of a bonding material, the cracks occurring in the workpiece 1 when the soot flows through a peeled spot can be reliably prevented. In addition, when the plurality of divided rectangular irradiation areas R are formed into narrow strip shapes, the occurrence of stress can be further reduced to further prevent the occurrence of cracks in the workpiece 1.

Further, as shown in FIGS. 8A and 8B or FIGS. 10A and 10B, the controlling part 50 preferably operates and controls the Z-axis moving mechanism 33 on the basis of measurement values measured by the length measuring part 40 so that an irradiation distance from the light irradiation part 22 to the plurality of irradiation areas R becomes substantially constant when the laser beams L are irradiated for each of the plurality of irradiation areas R from the light irradiation part 22.

In this case, it is possible to make an adjustment so that the irradiation distance between the separating layer 3 of the curved laminated body S held by the holding member 10 and the light irradiation part 22 becomes substantially constant.

Accordingly, even if the laminated body S is curved, the laser beams L can be uniformly irradiated to easily peel the supporting body 2 off the workpiece 1.

As a result, the laser beams L are uniformly applied onto the entire face of the separating layer 3 through the supporting body 2 even if the laminated body S is curved. Therefore, a partial peeling failure does not occur, and the output of the laser beams L does not become too strong. As a result, the occurrence of damage to a device formed in the circuit board of the workpiece 1 or the occurrence of soot due to partial excessive irradiation is prevented.

Therefore, the supporting body 2 can be separated from the curved workpiece 1 with high accuracy, and a high-performance and clean product is manufactured.

Note that the workpiece 1 and the supporting body 2 are bonded to each other by the separating layer 3 formed of a material having an adhesive property in the above embodiment. Besides this, when the separating layer 3 formed of a material having no adhesive property is used, the separating layer 3 and the workpiece 1 may be adhered to each other by the provision of an adhesive layer (not shown) formed of an adhesive agent between the separating layer 3 and the workpiece 1.

In addition, the example shown in the figures shows the workpiece-side moving type that mainly moves the side of the laminated body S with the optical-axis relative moving mechanism that serves as the driving part 30. Besides this, the optical-axis-side moving type that moves the light irradiation part 22 with the driving part 30 provided in only a part of the optical system 20 may be employed.

As a specific example, the laser scanner 22a (the polygon scanner 22a1 or the Galvano scanner 22a2) or the like of the light irradiation part 22 is moved in the Z direction as a part of the optical system 20, whereby it is possible to move the light irradiation positions P of the laser scanner 22a in the Z direction without moving the holding member 10 in irradiation within the same irradiation areas R.

REFERENCE SIGNS LIST

A Workpiece-separating device
S Laminated body
1 Workpiece
2 Supporting body
3 Separating layer
10 Holding member
20 Optical system
21 Laser source
22 Light irradiation part
22a Laser scanner
22b Lens
22b1 Telecentric lens
22b2 Non-telecentric lens
30 Driving part
31 X-axis moving mechanism
32 Y-axis moving mechanism
33 Z-axis moving mechanism
40 Length measuring part
50 Controlling part
L Laser beam
L1 Optical axis
L2 Main light beam
d Beam diameter
P Light irradiation position
R Irradiation area
Ra Boundary
Rb Distance

The invention claimed is:

1. A workpiece-separating device comprising:
a holder that detachably holds a workpiece of a laminated body in which the workpiece that includes a circuit board and a supporting body through which laser beams pass are laminated with each other via a separating layer that peelably alters due to at least absorption of the laser beams;
a light irradiation part that irradiates the laser beams from an outlet of the light irradiation part toward an entire face of the separating layer through the supporting body of the laminated body held by the holder;
a driver that relatively moves a light irradiation position of irradiation from the light irradiation part with respect to the supporting body and the separating layer of the laminated body held by the holder in at least a direction crossing a light irradiation direction of irradiation from the light irradiation part while maintaining a constant irradiation distance between the light irradiation position and the outlet of the light irradiation part; and
a controller that operates and controls the light irradiation part and the driver,
wherein the light irradiation part has a laser scanner that moves optical axes of spot-like laser beams pulse-oscillated from a laser source and is configured to perform sweeping on the laminated body;
wherein in an area of irradiation of the laser beams from the laser scanner toward the laminated body, an entire irradiated face of the separating layer is divided into a plurality of irradiation areas, and irradiation from the laser scanner onto the respective divided irradiation areas aligned irradiation in which the spot-like laser beams are arranged to partially overlap on a plane crossing the light irradiation direction, and
wherein the controller performs control to perform the aligned irradiation onto one irradiation area of the plurality of irradiation areas by at least an operation of the laser scanner while maintaining the constant irradiation distance, and after an entirety of one irradiation area of the plurality of irradiation areas is filled by the aligned irradiation with no gap, perform the aligned irradiation on a next irradiation area while maintaining the constant irradiation distance, and thereafter repeatedly perform the aligned irradiation for each of the irradiation areas similarly, thereby performing aligned irradiation on all of the plurality of irradiation areas finally.

2. The workpiece-separating device according to claim 1,
wherein the light irradiation part has a lens that guides the laser beams from the laser scanner toward the separating layer, and
wherein the lens is a telecentric lens, in which a main light beam is arranged in parallel with an optical axis of the lens, or a non-telecentric lens in which the main light beam is arranged at a prescribed angle with respect to the optical axis.

3. The workpiece-separating device according to claim 1, wherein
the driver has an X-axis moving mechanism and a Y-axis moving mechanism that relatively move the holder in two directions, which cross the light irradiation direction of irradiation from the light irradiation part, with respect to the light irradiation part.

4. The workpiece-separating device according to claim 1, wherein
a distance between the laser beams irradiated across boundaries of the plurality of irradiation areas is set to be smaller than a beam diameter of each of the laser beams.

5. The workpiece-separating device according to claim 1, wherein
the controller performs control so that, as an order of irradiation of the laser beams from the light irradiation part onto the plurality of irradiation areas, irradiation is performed such that the irradiation areas that are precedingly irradiated and the irradiation areas that are subsequently irradiated are separated.

6. The workpiece-separating device according to claim 1, comprising
a length measurer that measures an irradiation distance from the light irradiation part to irradiated faces of the supporting body and the separating layer, wherein
the driver has a Z-axis moving mechanism that relatively moves the holder in the light irradiation direction from the light irradiation part with respect to the light irradiation part, and
the controller operates and controls the Z-axis moving mechanism on a basis of measurement values measured by the length measurer to maintain the constant irradiation distance from the light irradiation part to the plurality of irradiation areas when the laser beams are irradiated, for each of the plurality of irradiation areas, from the light irradiation part.

7. A workpiece-separating method comprising:
a holding process of detachably holding on a holder a workpiece of a laminated body in which the workpiece that includes a circuit board and a supporting body through which laser beams pass are laminated with each other via a separating layer that peelably alters due to at least absorption of the laser beams;
a light irradiation process of irradiating the laser beams from an outlet of a light irradiation part toward an entire face of the separating layer through the supporting body of the laminated body held by the holder; and
a relative moving process of relatively moving by a driver a light irradiation position of radiation from the light irradiation part with respect to the supporting body and the separating layer of the laminated body held by the holder in at least a direction crossing a light irradiation direction of irradiation from the light irradiation part while maintaining a constant irradiation distance between the light irradiation position and the outlet of the light irradiation part,
wherein
the light irradiation part has a laser scanner that moves optical axes of spot-like laser beams pulse-oscillated from a laser source and is configured to perform sweeping on the laminated body,
wherein in an area of irradiation of the laser beams from the laser scanner toward the laminated body in the light irradiation process, an entire irradiated face of the separating layer is divided into a plurality of irradiation areas, and irradiation from the laser scanner onto the respective divided irradiation areas is aligned irradiation in which the spot-like laser beams are arranged to partially overlap on a plane crossing the light irradiation direction, and
wherein in the relative moving process, the aligned irradiation is performed on one irradiation area of the plurality of irradiation areas by at least an operation of the laser scanner while maintaining the constant irradiation distance, and after an entirety of one irradiation area of the plurality of irradiation areas is filled by the aligned irradiation with no gap, the aligned irradiation is performed on a next irradiation area while maintaining the constant irradiation distance, and thereafter the aligned irradiation is repeatedly performed for each of the irradiation areas similarly, thereby performing aligned irradiation on all of the plurality of irradiation areas finally.

8. The workpiece-separating device according to claim 2, wherein the driver has an X-axis moving mechanism and a Y-axis moving mechanism that relatively move the holder in two directions, which cross the light irradiation direction of irradiation from the light irradiation part, with respect to the light irradiation part.

9. The workpiece-separating device according to claim 2, wherein a distance between the laser beams irradiated across boundaries of the plurality of irradiation areas is set to be smaller than a beam diameter of each of the laser beams.

10. The workpiece-separating device according to claim 2, wherein the controller performs control so that, as an order of irradiation of the laser beams from the light irradiation part onto the plurality of irradiation areas, irradiation is performed such that the irradiation areas that are precedingly irradiated and the irradiation areas that are subsequently irradiated are separated.

11. The workpiece-separating device according to claim 2, comprising
a length measurer that measures an irradiation distance from the light irradiation part to irradiated faces of the supporting body and the separating layer,
wherein the driver has a Z-axis moving mechanism that relatively moves the holder in the light irradiation direction from the light irradiation part with respect to the light irradiation part, and
wherein the controller operates and controls the Z-axis moving mechanism on a basis of measurement values measured by the length measurer to maintain the constant irradiation distance from the light irradiation part to the plurality of irradiation areas when the laser beams are irradiated, for each of the plurality of irradiation areas, from the light irradiation part.

12. The workpiece-separating device according to claim 5, wherein
the controller performs control so that the irradiation areas that are precedingly irradiated and the irradiation areas that are subsequently irradiated are separated by an intervening unirradiated irradiation area to form a discontinuous irradiation of the separating layer.

* * * * *